US006737177B2

(12) United States Patent
Aziz et al.

(10) Patent No.: US 6,737,177 B2
(45) Date of Patent: *May 18, 2004

(54) RED ORGANIC LIGHT EMITTING DEVICES

(75) Inventors: Hany Aziz, Burlington (CA); Nan-Xing Hu, Oakville (CA); Zoran D. Popovic, Mississauga (CA); Ah-Mee Hor, Mississauga (CA)

(73) Assignee: Xerox Corporation, Stamford, CT (US)

( * ) Notice: Subject to any disclaimer, the term of this patent is extended or adjusted under 35 U.S.C. 154(b) by 111 days.

This patent is subject to a terminal disclaimer.

(21) Appl. No.: 10/005,404

(22) Filed: Nov. 8, 2001

(65) Prior Publication Data

US 2003/0104242 A1 Jun. 5, 2003

(51) Int. Cl.$^7$ ................................................ H05B 33/12
(52) U.S. Cl. ........................ 428/690; 428/917; 313/504; 313/506
(58) Field of Search ................................ 428/690, 917, 428/213, 332; 313/504, 506; 427/66

(56) References Cited

U.S. PATENT DOCUMENTS

| | | | |
|---|---|---|---|
| 4,356,429 A | 10/1982 | Tang ........................... | 313/503 |
| 4,539,507 A | 9/1985 | VanSlyke et al. ............ | 313/504 |
| 4,720,432 A | 1/1988 | VanSlyke et al. ............ | 428/457 |
| 4,769,292 A | 9/1988 | Tang et al. .................. | 428/690 |
| 5,061,569 A | 10/1991 | VanSlyke et al. ............ | 428/457 |
| 5,141,671 A | 8/1992 | Bryan et al. ............ | 252/301.16 |
| 5,150,006 A | 9/1992 | VanSlyke et al. ............ | 313/504 |
| 5,151,629 A | 9/1992 | VanSlyke et al. ............ | 313/504 |
| 5,227,252 A | 7/1993 | Murayama et al. .......... | 428/690 |
| 5,458,977 A * | 10/1995 | Hosokawa et al. ....... | 428/411.1 |
| 5,516,577 A | 5/1996 | Matsuura et al. ............ | 428/212 |
| 5,601,903 A | 2/1997 | Fujii et al. ................... | 428/212 |
| 5,639,914 A * | 6/1997 | Tomiyama et al. .......... | 564/309 |
| 5,739,635 A | 4/1998 | Wakimoto ................... | 313/504 |
| 5,792,557 A * | 8/1998 | Nakaya et al. ............ | 428/411.1 |
| 5,846,666 A | 12/1998 | Hu et al. ..................... | 428/690 |
| 5,853,905 A | 12/1998 | So et al. ...................... | 428/690 |
| 5,925,472 A | 7/1999 | Hu et al. ..................... | 428/690 |
| 5,925,980 A | 7/1999 | So et al. ...................... | 313/504 |
| 5,935,720 A | 8/1999 | Chen et al. .................. | 428/690 |
| 5,942,340 A | 8/1999 | Hu et al. ..................... | 428/690 |
| 5,952,115 A | 9/1999 | Hu et al. ..................... | 428/690 |
| 6,057,048 A | 5/2000 | Hu et al. ..................... | 428/690 |
| 6,114,055 A | 9/2000 | Choong et al. .............. | 428/690 |
| 6,130,001 A | 10/2000 | Shi et al. ..................... | 428/690 |
| 6,194,119 B1 | 2/2001 | Wolk et al. .................. | 430/200 |
| 6,229,012 B1 | 5/2001 | Hu et al. ..................... | 544/180 |
| 6,303,238 B1 | 10/2001 | Thompson et al. .......... | 428/690 |
| 2001/0053462 A1 * | 12/2001 | Mishima ...................... | 428/690 |
| 2002/0034659 A1 * | 3/2002 | Nishi et al. .................. | 428/690 |

FOREIGN PATENT DOCUMENTS

| | | |
|---|---|---|
| EP | 1227527 A2 | 7/2002 |
| WO | WO 9920081 | 4/1999 |

OTHER PUBLICATIONS

O'Brien et al., Applied Physics Letters, vol. 74, No. 3, pp. 442–444, Jan. 18, 1999.*
Adachi et al., Applied Physics Letters, vol. 78, No. 11, pp. 1622–1624, Mar. 12, 2001.*
Heil et al., Journal of Applied Physics, vol. 90, No. 10, pp. 5357–5362, Nov. 15, 2001.*
Copending application Ser. No. 09/357,551, filed Jul. 20, 1999, on "Organic Light Emitting Devices Having Improved Efficiency And Operation Lifetime" by Hany Aziz et al.
Copending application Ser. No. 09/606,670, filed Jun. 30, 2000, on "Organic Light Emitting Devices Having Improved Performance" by Hany Aziz et al.
Copending application Ser. No. 09/800,716 on "Cathodes For Electroluminescent Devices Having Improved Contrast And Reduced Dark Spot Growth" by Yoon–Fei Liew et al.
Copending application Ser. No. 09/770,159, filed Jan. 26, 2001, on "Organic Light Emitting Devices" by Hany Aziz et al.
Copending application Ser. No. 09/770,154, filed Jan. 26, 2001, on "Electroluminescent Devices" by Hany Aziz et al.
Copending application Ser. No. 09/935,031, filed Aug. 22, 2001, on "Oleds Having Light Absorbing Electrode" by Hany Aziz et al.
S.A. Van Slyke et al., "Organic Electroluminescent Devices with Improved Stability", Appl. Phys. Lett. 69, pp. 2160–2162, 1996.
Kido et al., "Organic Electroluminescent Devices Based on Molecularly Doped Polymers", Appl. Phys. Lett. 61, pp. 761–763, 1992.
S. Naka et al., "Organic Electroluminescent Devices Using a Mixed Single Layer," Jpn. J. Appl. Phys. 33, pp. L1772–L1774, 1994.
W. Wen et al., Appl. Phys. Lett. 71, 1302 (1997).
C. Wu et al., "Efficient Organic Electroluminescent Devices Using Single–Layer Doped Polymer Thin Films with Bipolar Carrier Transport Abilities", IEEE Transactions on Electron Devices 44, pp. 1269–1281, 1997.
H. Aziz et al., Science 283, 1900 (1999).
Z.D. Popovic et al., Proceedings of the SPIE, vol. 3176, "Organic Light–Emitting Materials and Devices II", San Diego, Ca, Jul. 21–23, 1998, pp. 68–73.
Y. Hamada et al., "Influence of the Emission Site on the Running Durability of Organic Electroluminescent Devices", Jpn. J. Appl. Phys. 34, pp. L824–L826, 1995.
Zhou et al., "Real–Time Observation of Temperature Rise and Thermal Breakdown Processes in Organic Leds Using an IR Imaging And Analysis System", Advanced Materials 12, pp. 265–269, 2000.
J.R. Sheats et al., "Organic Electroluminescent Devices", Science 273, pp. 884–888, 1996.
S. Tokito et al., "High–Temperature Operation of an Electroluminescent Device Fabricated Using a Novel Triphenylamine Derivative", Appl. Phys. Lett. 69, 878 (1996).

* cited by examiner

Primary Examiner—Cynthia H. Kelly
Assistant Examiner—Dawn Garrett
(74) Attorney, Agent, or Firm—E. O. Palazzo (57) ABSTRACT

An organic light emitting, or EL device containing a number of layers, and containing red emitting compounds or components.

38 Claims, 1 Drawing Sheet

RED ORGANIC LIGHT EMITTING DEVICES

COPENDING APPLICATIONS

Illustrated in copending application U.S. Ser. No. 10/005, 930, filed concurrently herewith, the disclosure of which is totally incorporated herein by reference, is an organic light emitting device comprising
  (i) a first electrode;
  (ii) a mixed region comprising a first hole transport material and a first electron transport material;
  (iii) a second electrode;
  (iv) an optional thermal protective layer coated on one of the first and second electrodes, wherein one of said first and second electrodes is a hole injection anode, and one of said electrodes is an electron injection cathode, and wherein the organic light emitting device further comprises at least one of
  (v) a hole transport region interposed between said anode and said mixed region; and wherein said hole transport region is comprised of a second hole transport material, and which material is in contact with the mixed region; and
  (vi) an electron transport region interposed between said cathode and said mixed region, and wherein said region is comprised of a second electron material, and which material is in contact with the mixed region; and containing at least one of
    a. said hole transport region (v) wherein said first hole transport material (ii) is similar to or dissimilar than said second hole transport material (v);
    b. said electron transport region (vi) wherein said first electron transport material (ii) is similar to or dissimilar than said second electron transport material (vi); and wherein when a. is similar, b. is dissimilar; when a. is dissimilar, b. is similar or dissimilar; and when b. is dissimilar, a. is similar or dissimilar.

Illustrated in copending application U.S. Ser. No. 10/005, 518, filed concurrently herewith, the disclosure of which is totally incorporated herein by reference, is an organic light emitting device comprising
  (i) a first electrode;
  (ii) a mixed region comprising a mixture of (1) a tertiary aromatic amine, (2) a metal oxinoid, and (3) a green emitting coumarin dye of the Formula wherein X is selected from the group consisting of an oxygen atom, a sulfur atom, an alkyl imino group and aryl imino group; $R_1$ and $R_2$ are individually selected from the group consisting of alkyl, aryl, and carbocyclic; $R_3$ and $R_4$ are individually selected from the group consisting of a hydrogen atom, alkyl, and optionally a branched or unbranched 5 or 6 member substituent ring connecting with $R_1$ and $R_2$, respectively; and $R_5$, $R_6$, $R_7$, and $R_8$ are individually selected from the group consisting of a hydrogen atom, an alkoxy group and an alkyl group;
  (iii) a second electrode;
  (iv) an optional thermal protective element coated on one of the first and second electrodes; wherein one of the first and second electrodes is a hole injecting anode, and one of the first and second electrodes is an electron injecting cathode, and wherein the organic light emitting device further comprises at least one of
  (v) a hole transport region interposed or situated between the anode and the mixed region, wherein the hole transport region optionally includes a buffer layer; and
  (vi) an electron transport region interposed between the cathode and the mixed region, and wherein said green emitting dye is present in an amount of from about 0.01 to about 10 weight percent based on the total of said mixed layer components (ii).

Illustrated in copending application U.S. Ser. No. 10/005, 970, filed concurrently herewith, the disclosure of which is totally incorporated herein by reference, is an organic light emitting device comprising
  (i) an anode;
  (ii) a hole transport layer comprising a mixture of a porphyrin and a hole transport material;
  (iii) a mixed region comprising a mixture of (1) a hole transport material, and (2) an electron transport material, and which mixed region optionally contains an organic luminescent material;
  (iv) a cathode; and wherein the organic light emitting device optionally further comprises at least one of
  (v) an electron transport region interposed between the mixed region and the cathode; and
  (vi) an optional thermal protective element coated on one of the anode and cathode.

Illustrated in copending application U.S. Ser. No. 10/005, 993, filed concurrently herewith, the disclosure at which is totally incorporated herein by reference, is an organic light emitting device, comprising
  (i) a first electrode;
  (ii) a region comprising a mixture of (1) N,N'-bis(p-biphenyl)-N,N'-diphenyl benzidine, and (2) an electron transport material, and which region further optionally comprises an organic luminescent material, and wherein said mixed region is capable of emitting light in response to hole-electron recombination;
  (iii) a second electrode;
  (iv) an optional thermal layer coated on at least one of the first and second electrodes, wherein one of said first and second electrodes is a hole injection anode, and one of said electrodes is an electron injection cathode, and wherein the organic light emitting device further comprises at least one of
  (v) a hole transport region interposed or situated between the first electrode and the mixed region; and
  (vi) an electron transport region interposed or situated between the mixed region and the cathode.

Illustrated in copending application U.S. Ser. No. 09/935, 031, filed Aug. 22, 2001 on "OLEDs Having Light Absorbing Electrode", the disclosure of which is totally incorporated herein by reference, is an organic light emitting device comprising
  a first electrode;
  a second electrode; and
  a luminescent region including an organic electroluminescent material between the first electrode and the second electrode, wherein one of the first electrode and the second electrode includes both a substantially transparent charge injecting layer adjacent to the luminescent region and an electrically conductive light absorbing layer.

Illustrated in U.S. Pat. No. 6,392,339 on "Organic Light Emitting Devices Having Improved Efficiency and Operation Lifetime", filed on Jul. 20, 1999, the disclosure of which is totally incorporated herein by reference, is an organic light emitting device, comprising, for example, a mixed region comprising a mixture of a hole transport material and an electron transport material, one of the hole transport material and the electron transport material being an emitter, the mixed region having a first surface and a second surface;

at least one of (i) a hole transport material on the first surface, and (ii) an electron transport material on the second surface;

an anode in contact with the hole transport material on the first surface or with the first surface; and a cathode in contact with the electron transport material on the second surface or with the second surface; and U.S. Pat. No. 6,392,250 on "Organic Light Emitting Devices Having Improved Performance", filed on Jun. 30, 2000, the disclosure of which is totally incorporated herein by reference, is an organic light emitting device, comprising, for example, a mixed region having a first surface and a second surface, the mixed region comprising a mixture of a hole transport material, an electron transport material and at least one dopant, the dopant being an emitter, at least one of the hole transport material and the electron transport material optionally being an emitter;

at least one of (i) a hole transport region on the first surface, and (ii) an electron transport region on the second surface;

an anode in contact with the hole transport region on the first surface or with the first surface; and a cathode in contact with the electron transport region on the second surface or with the second surface.

Illustrated in copending applications U.S. Ser. No. 09/770,159 on "Organic Light Emitting Devices", filed Jan. 26, 2001, the disclosure of which is totally incorporated herein by reference, is an organic light emitting device comprising, for example, in an optional sequence (i) a substrate;

(ii) a first electrode;

(iii) a mixed region comprising a mixture of a hole transport material and an electron transport material, and wherein this mixed region includes at least one organic luminescent material;

(iv) a second electrode;

(v) a thermal protective element coated on the second electrode, wherein one of the two said first and second electrodes is a hole injection anode, and one of the two said electrodes is an electron injection cathode, and wherein the organic light emitting device further comprises;

(vi) a hole transport region, interposed between the anode and the mixed region, wherein the hole transport region optionally includes a buffer layer; and (vii) an electron transport region interposed between the second electrode and the mixed region; and in U.S. Ser. No. 09/770,154 on "Electronluminescent Devices", filed on Jan. 26, 2001, the disclosure of which is totally incorporated herein by reference, is disclosed an organic light emitting device comprising in sequence a substrate;

a first electrode;

a light emitting region comprising an organic luminescent material; and a second electrode, and a thermal protective element.

Illustrated in now abandoned application U.S. Ser. No. 09/800,716 on "Cathodes For Electroluminescent Devices Having Improved Contrast and Reduced Dark Spot Growth", filed on Mar. 8, 2001, the disclosure of which is totally incorporated herein by reference, is an electroluminescent device, comprising:

a first electrode;

a second electrode; and a luminescent region between the first electrode and the second electrode, wherein one of the first electrode and the second electrode comprises a metal-organic mixed region including:

a metal;

an organic material; and at least one component selected from the group consisting of metals, organic materials and inorganic materials.

BACKGROUND

The present invention relates to optoelectronic devices and, more particularly, to organic light emitting devices (organic EL devices). More specifically, the present invention relates to substantially stable organic EL devices, such as, for example, organic EL devices with a half-life in embodiments of, for example, not less than about 1,000 hours, that is the device possesses a half-life of at least about 1,000 hours even at which devices in embodiments are stable high temperatures, such as from about 70° C. to about 100° C., and moreover, which devices are not substantially adversely affected by high temperatures; and yet, more specifically, possess a combination of desirable features, such as (1) an excellent stability, such as, for example, a half-life of at least 1,000 hours from an initial luminance of about 100 cd/m$^2$ at elavated temperatures of about 80° C. to 100° C.; (2) an excellent quantum efficiency, such as, for example, an external quantum efficiency of at least about 4 percent when operated at a luminance of 100 cd/m$^2$; and (3) an improved color purity, such as, for example, color coordinates of about 0.679, 0.319 on the C.I.E. chart.

REFERENCES

An organic electroluminescent (EL) device can be comprised of a layer of an organic luminescent material interposed between an anode, typically comprised of a transparent conductor, such as indium tin oxide, and a cathode, typically a low work function metal such as magnesium, calcium, aluminum, or the alloys thereof with other metals. The EL device functions on the primary principle that under an electric field, positive charges (holes) and negative charges (electrons) are respectively injected from the anode and cathode into the luminescent layer and undergo recombination to form excitonic states which subsequently emit light. A number of organic EL devices have been prepared from a laminate of an organic luminescent material and electrodes of opposite polarity, which devices include a single crystal material, such as single crystal anthracene as the luminescent substance as described, for example, in U.S. Pat. No. 3,530,325, the disclosure of which is totally incorporated herein by reference. These types of devices are believed to require excitation voltages on the order of 100 volts or greater.

An organic EL device with a multilayer structure can be formed as a dual layer structure comprising one organic layer adjacent to the anode supporting hole transport, and another organic layer adjacent to the cathode supporting electron transport and acting as the organic luminescent zone of the device. Examples of these devices are disclosed in U.S. Pat. Nos. 4,356,429; 4,539,507; 4,720,432, and 4,769,292, the disclosures of which are totally incorporated herein by reference, wherein U.S. Pat. No. 4,769,292, the disclosure of which is totally incorporated herein by reference, discloses, for example, an organic EL device comprising three separate layers, a hole transport layer, a luminescent layer, and an electron transport layer, which layers are laminated in sequence and are sandwiched between an anode and a cathode, and wherein a fluorescent dopant material is added to the emission zone or layer whereby the recombination of charges results in the excitation of the fluorescent material. In some of these multilayer structures, such as, for example, organic light emitting devices described in U.S. Pat. No. 4,720,432, the disclosure of which is totally incorporated herein by reference, the organic light emitting device further comprises a buffer layer interposed between the hole transport layer and the anode. The combination of the hole transport layer and the buffer layer forms a dual-layer hole transport region, reference S. A. Van Slyke et al., "Organic Electroluminescent Devices with Improved Stability," *Appl. Phys. Lett.* 69, pp. 2160–2162, 1996, the disclosure of which is totally incorporated herein by reference.

There have also been attempts to obtain electroluminescence from organic light emitting devices containing mixed layers, for example, layers in which both the hole transport material and the emitting electron transport material are mixed together in one single layer, see, for example, Kido et al., "Organic Electroluminescent Devices Based On Molecularly Doped Polymers," *Appl. Phys. Lett.* 61, pp. 761–763, 1992; S. Naka et al., "Organic Electroluminescent Devices Using a Mixed Single Layer," *Jpn. J. Appl. Phys.* 33, pp. L1772–L1774, 1994; W. Wen et al., *Appl. Phys. Lett.* 71, 1302 (1997); and C. Wu et al., "Efficient Organic Electroluminescent Devices Using Single-Layer Doped Polymer Thin Films with Bipolar Carrier Transport Abilities", *IEEE Transactions on Electron Devices* 44, pp. 1269–1281, 1997. In a number of these devices, the electron transport material and the emitting material can be the same or the mixed layer can further comprise an emitting material as a dopant. Other examples of organic light emitting devices which are formed of a single organic layer comprising a hole transport material and an electron transport material can be found, for example, in U.S. Pat. Nos. 5,853,905; 5,925,980; 6,114,055 and 6,130,001, the disclosures of which are totally incorporated herein by reference. As indicated in the article by S. Naka et al., these single mixed layer organic light emitting devices are generally less efficient than multilayer organic light emitting devices. These devices, which include only a single mixed layer of a hole transport material, such as NBP (N,N'-di(naphthalene-1-yl)-N,N'-diphenyl-benzidine), and an emitting electron transport material, such as $Alq_3$ (tris (8-hydroxyquinoline) aluminum), are believed to be unstable and to have poor efficiency. The instability of these devices is believed to be caused by the direct contact between the electron transport material in the mixed layer and the hole injecting contact comprised of indium tin oxide (ITO), which results in the formation of an unstable cationic electronic transport material, and the instability of the mixed layer/cathode interface, see H. Aziz et al., *Science* 283, 1900 (1999), the disclosure of which is totally incorporated herein by reference. In addition, the single mixed layer may result in high leakage currents and hence poor efficiency, see Z. D. Popovic et al., *Proceedings of the SPIE*, Vol. 3176, "Organic Light-Emitting Materials and Devices II", San Diego, Calif., Jul. 21–23, 1998, pp. 68 to 73, the disclosure of which is totally incorporated herein by reference.

While recent progress in organic EL research has elevated the potential of organic EL devices for widespread applications, the operational stability of current available devices may in some instances be below expectations. A number of known organic light emitting devices have relatively short operational lifetimes before their luminance drops to some percentage of its initial value. Providing interface layers as described, for example, in S. A. Van Slyke et al., "Organic Electroluminescent Devices with Improved Stability," *Appl. Phys. Lett.* 69, pp. 2160–2162, 1996, and doping as described, for example, in Y. Hamada et al., "Influence of the Emission Site on the Running Durability of Organic Electroluminescent Devices", *Jpn. J. Appl. Phys.* 34, pp. L824–L826, 1995, may perhaps increase the operational lifetime of organic light emitting devices for room temperature operation, however, the effectiveness of these organic light emitting devices deteriorates for high temperature device operation. In general, the device lifetime can be reduced by a factor of about two for each 10° C. increment in the operational temperature. Moreover, at high temperatures, the susceptibility of the organic light emitting devices to degrade is increased as described, for example, in Zhou et al., "Real-Time Observation of Temperature Rise and Thermal Breakdown Processes in Organic Leds Using an IR Imaging And Analysis System", *Advanced Materials* 12, pp 265–269, 2000, which further reduces the stability of the devices. As a result, the operational lifetime of these organic light emitting devices at a normal display luminance level of about 100 cd/m² is limited, for example, to about a hundred hours or less at temperatures of about 60° C. to about 80° C., reference J. R. Sheats et al., "Organic Electroluminescent Devices", *Science* 273, pp. 884–888, 1996, and also S. Tokito et al., "High-Temperature Operation of an Electroluminescent Device Fabricated Using a Novel Triphenylamine Derivative", *Appl. Phys. Lett.* 69, 878 (1996).

SUMMARY

Aspects of the present invention relate to an organic light emitting device comprising (i) a first electrode;

(ii) a region comprising a mixture of (1) a tertiary aromatic amine, (2) a metal oxinoid, and (3) a red emitting material represented by wherein X is a carbon C atom or a nitrogen N atom or optionally oxygen or sulfur; $R_1$, $R_2$ and $R_3$ are appropriate groups, such as each being independently selected from the group consisting of hydrogen, alkyl, substituted alkyl, aryl, and substituted aryl; M is a divalent, trivalent or tetravalent metal;

(iii) a second electrode;

(iv) an optional protective element coated on at least one of the first and second electrodes, wherein one of said first and second electrodes is a hole injection anode, and one of said electrodes is an electron injection cathode; and at least one of (v) a hole transport region situated between the anode and the region (ii), and wherein the hole transport region optionally includes a buffer layer; and (vi) an electron transport region situated between the cathode and the region (ii), and wherein said red emitting component is present in an amount of from 1 to about 40 weight percent based on total weights of components in region (ii); organic light emitting device wherein the red emitting material is 2,3,7,8,12,13,17, 18-octaethyl-21H,23H-porphine platinum (II) (PtOEP); an organic light emitting device wherein the tertiary aromatic amine is N,N,N',N'-tetraaryl benzidine; an organic light emitting device wherein said amine is N,N,N',N'-tetraaryl benzidine selected from the group consisting of N,N'-di(naphthalene-1-yl)-N, N'-diphenyl-benzidine (NPB) and N,N'-bis(p-biphenyl)-N,N'-diphenyl benzidine (biphenyl TPD); and optionally wherein the metal oxinoid is tris(8-hydroxyquinoline) aluminum ($Alq_3$); an organic light emitting device wherein there is at least one of said hole transport region comprising a component or compound selected from the group consisting of tertiary aromatic amines, porphyrins, and indolocarbazoles; and said electron transport region containing a component selected from the group consisting of metal oxinoids, stilbenes, triazines, porphyrins, and quinolines; an organic light emitting device wherein region (ii) comprises from about 20 weight percent to about 80 weight percent of said tertiary aromatic amine, and from about 80 weight percent to about 20 weight percent of said metal oxinoid; and wherein the weight percents are based on the total weight of components comprising the mixed region; an organic light emitting device wherein region (ii) comprises from about 35 weight percent to about 65 weight percent of said tertiary aromatic amine; from about 65 weight percent to about 35 weight percent of said metal oxinoid; and from about 3 weight percent to about 30 weight percent of said red emitting component, and wherein the total thereof is about 100 weight percent; an organic light emitting device wherein region (ii) comprises from about 5 weight percent to about 25 weight percent of said red emitting material; an organic light emitting device wherein there is at least one of A. said component of the hole transport region (v) and the tertiary aromatic amine comprising region (ii) are similar; and B. wherein the electron transport region (vi) and the metal oxinoid comprising region (ii) contain similar components; an organic light emitting device wherein at least one of A. said hole transport region (v) and the tertiary aromatic amine comprising region (ii) are dissimilar; and B. said electron transport region (vi) and the metal oxinoid comprising the mixed region are dissimilar; an organic light emitting device wherein an electron transport region is present, and wherein the electron transport region comprises at least two layers; an organic light emitting device wherein a first layer of the electron transport region contacts the mixed region, and which first layer comprises a component selected from the group consisting of metal oxinoids, and quinolines; and a second layer of the electron transport region contacts the cathode, and which second layer comprises a component selected from the group of metal oxinoids, phthalocyanines, and triazines; an organic light emitting device wherein the first layer contains a metal oxinoid of tris(8-hydroxyquinoline) aluminum ($Alq_3$), bis(8-hydroxyquinolato)-(4-phenylphenolato) aluminum (Balq), or a quinoline of 1,4-bis(4-phenylquinolin-2-yl)benzene, 4,4'-bis(4-phenylquinolin-2-yl)-1,1'-biphenyl (TA); and the second layer contains a metal oxinoid comprising tris (8-hydroxyquinoline) aluminum ($Alq_3$) or bis(8-hydroxyquinolato)-(4-phenylphenolato)aluminum (Balq), a phthalocyanine of copper phthalocyanine (CuPc), or a triazine of 4,4'-bis-[2-(4,6-diphenyl-1,3,5-triazinyl)]-1,1'-biphenyl, 4,4'-bis-[2-(4,6-di-p-tolyl-1,3, 5-triazinyl)]-1,1'-biphenyl, 4,4'-bis-[2-(4,6-di-m-tolyl-1,3,5-triazinyl)]-1,1'-biphenyl, 4,4'-bis-[2-(4,6-di-p-methoxyphenyl-1,3,5-triazinyl)]-1,1 '-biphenyl, 4,4'-bis-[2-(4,6-di-m-methoxyphenyl-1,3,5-triazinyl)]-1,1'-biphenyl, or 2,4,6-tris(4-biphenylyl)-1,3,5-triazine; an organic light emitting device wherein said hole transport region (v) is present, and wherein the hole transport region comprises at least two layers; an organic light emitting device wherein a first layer of the hole transport region contacts the anode, and which first layer comprises a porphyrin; and wherein a second layer of the hole transport region contacts the mixed region, and which second layer comprises a component selected from the group of tertiary aromatic amines and indolocarbazoles; an organic light emitting device wherein the first layer comprises copper phthalocyanine; and the second layer comprises a tertiary aromatic amine of N,N'-di(naphthalene-1-yl)-N,N'-diphenyl-benzidine (NPB) or N,N'-bis(p-biphenyl)-N,N'-diphenyl benzidine (biphenyl TPD), or an indolocarbazole of 5,11-di-naphthyl-5,11-dihydroindolo[3,2-b] carbazole or 2,8-dimethyl-5,11-di-naphthyl-5,11-dihydroindolo[3,2-b]carbazole; an organic light emitting device wherein a hole transport region (v) is present, and wherein the hole transport region comprises a layer comprised of a mixture of (i) from about 25 weight percent to about 99 weight percent of a porphyrin, and (ii) from about 75 weight percent to about 1 weight percent of an aromatic tertiary amine or an indolocarbazole; an organic light emitting device wherein there is present at least one of (1) an anode comprising a layer comprised of indium-tin-oxide, and (2) a cathode comprising a layer selected from the group consisting of (i) a layer comprised of Mg and Ag; (ii) a layer comprised of Al; (iii) a layer comprised of indium-tin-oxide; and (iv) a layer comprised of a mixture of an organic compound of Mg and Ag; an organic light emitting device wherein the cathode further comprises an alkaline metal or a compound thereof; an organic light emitting device wherein the alkaline metal is selected from the group consisting of Li, Na, K and Cs; an organic light emitting device wherein the thermal protective element is present, and which thermal protective element comprises a layer of SiO, $SiO_2$ or mixtures thereof; an organic light emitting device wherein region (ii) has a thickness of from about 5 nanometers to about 500 nanometers; the hole transport region has a thickness of from about 5 nanometers to about 250 nanometers; and/or the electron transport region has a thickness of from about 5 nanometers to about 100 nanometers; an organic light emitting device comprising (i) an anode of indium-tin-oxide with a thickness of from about 30 to about 300 nanometers coated on a substrate, the anode and the substrate being capable of transmitting at least about 70 percent of radiation of wavelength equal to or longer than about 400 nanometers;

(ii) a hole transport region contained on the anode and comprised of a compound selected from the group consisting of copper phthalocyanine (CuPc), N,N'-di(naphthalene-1-yl)-N,N'-diphenyl-benzidine (NPB), N,N'-bis(p-biphenyl)-N, N'-diphenyl benzidine (biphenyl TPD), 5,11-di-naphthyl-5,11-dihydroindolo[3,2-b]carbazole, and 2,8-dimethyl-5,11-di-naphthyl-5,11-dihydroindolo[3,2-b]carbazole; and which region has a thickness of from about 5 nanometers to about 100 nanometers;

(iii) a mixed region situated on the hole transport region and comprised of (1) from about 35 weight percent to about 65 weight percent of N,N'-di(naphthalene-1-yl)-N,N'-diphenyl-benzidine (NPB) or N,N'-bis(p-biphenyl)-N,N'-diphenyl benzidine (biphenyl TPD); (2) from about 65 weight percent to about 35 weight percent of tris(8-hydroxyquinoline) aluminum or bis(8-hydroxyquinolato)-(4-phenylphenolato)aluminum; and (3) from about 5 weight percent to about 25 weight percent of 2,3,7,8,12,13,17,18-octaethyl-21H,23H-porphine platinum (II) (PtOEP), and wherein all weight percentages are based on the total weight of components comprising the mixed region, and wherein the thickness of the mixed region is from about 50 nanometers to about 150 nanometers;

(iv) an electron transport region situated on the mixed region, and comprised of tris(8-hydroxyquinoline) aluminum ($Alq_3$) or bis(8-hydroxyquinolato)-(4-phenylphenolato)aluminum (Balq), and wherein the thickness of the electron transport region is from about 5 nanometers to about 50 nanometers;

(v) a cathode situated on the electron transport region, and comprised of one of (1) a layer comprising a Mg:Ag alloy or Al of a thickness of from about 50 nanometers to about 500 nanometers; and (2) a first layer comprised of from about 40 volume percent to about 55 volume percent of Mg; from about 2 volume percent to about 10 volume percent of Ag and from about 55 volume percent to about 40 volume percent of Alq3; wherein the thickness of the first layer is from about 100 nanometers to about 600 nanometers, and which first layer is coated with a second layer of a thickness of from about 50 nanometers to about 500 nanometers comprising a metal or a metal alloy; and (vi) a protective layer situated on the cathode comprised of SiO, $SiO_2$ or mixtures thereof of a thickness of from about 100 nanometers to about 1,000 nanometers; an organic light emitting device comprised of (i) an anode of indium-tin-oxide with a thickness of from about 30 to about 300 nanometers, which anode is coated on a substrate, the anode and the substrate being capable of transmitting at least 70 percent of radiation of wavelength longer than about 400 nanometers;

(ii) a hole transport region present on the anode and which region contains a component selected from the group consisting of N,N'-di(naphthalene-1-yl)-N,N'-diphenyl-benzidine (NPB), N,N'-bis(p-biphenyl)-N, N'-diphenyl benzidine (biphenyl TPD), 5,11-di-naphthyl-5,11-dihydroindolo[3,2-b]carbazole, and 2,8-dimethyl-5,11-di-naphthyl-5,11-dihydroindolo [3,2-b]carbazole, and which region further contains a buffer layer contacting the anode of copper phthalocyanine, wherein the thickness of the buffer layer is from about 10 nanometers to about 30 nanometers and the thickness of the hole transport region is from about 5 nanometers to about 20 nanometers greater than the thickness of the buffer layer;

(iii) a mixed region situated on the hole transport region comprised of (1) from about 35 weight percent to about 65 weight percent of N,N'-di(naphthalene-1-yl)-N,N'-diphenyl-benzidine (NPB) or N,N'-bis(p-biphenyl)-N,N'-diphenyl benzidine (biphenyl TPD); (2) from about 65 weight percent to about 35 weight percent of tris(8-hydroxyquinoline) aluminum or bis (8-hydroxyquinolato)-(4-phenylphenolato) aluminum; and (3) from about 5 weight percent to about 25 weight percent of 2,3,7,8,12,13,17,18-octaethyl-21H,23H-porphine platinum (II) (PtOEP), wherein all weight percentages are based on the total weight of components comprising the mixed region, and wherein the thickness of the mixed region is from about 50 nanometers to about 150 nanometers;

(iv) an electron transport region situated on the mixed region of tris(8-hydroxyquinoline) aluminum ($Alq_3$) or bis(8-hydroxyquinolato)-(4-phenylphenolato) aluminum (Balq), wherein the thickness of the electron transport region is from about 5 nanometers to about 50 nanometers;

(v) a cathode situated on the electron transport region comprised of one of (1) a layer comprised of Mg:Ag alloy or Al of a thickness of from about 50 nanometers to about 500 nanometers; and (2) a first layer comprised of from about 40 volume percent to about 55 volume percent of Mg; from about 2 volume percent to about 10 volume percent of Ag and from about 55 volume percent to about 40 volume percent of $Alq_3$, wherein the thickness of the first layer is from about 100 nanometers to about 600 nanometers; and which first layer is coated with a second layer of a thickness of from about 50 nanometers to about 500 nanometers comprising a metal or a metal alloy; and (vi) an optional thermal layer situated on the cathode comprised of SiO, SiO$_2$ or mixtures thereof of a thickness of from about 100 nanometers to about 1,000 nanometers; an organic light emitting device comprising
  (i) an anode of indium-tin-oxide with a thickness of from about 30 to about 300 nanometers, which anode is coated on a substrate, the anode and the substrate being capable of transmitting at least about 70 percent of radiation of wavelength longer than about 400 nanometers;
  (ii) a hole transport region situated on the anode comprised of at least one component selected from the group consisting of copper phthalocyanine (CuPc), N,N'-di(naphthalene-1-yl)-N,N'-diphenyl-benzidine (NPB), N,N'-bis(p-biphenyl)-N,N'-diphenyl benzidine (biphenyl TPD), 5,11-di-naphthyl-5,11-dihydroindolo[3,2-b]carbazole, and 2,8-dimethyl-5,11-di-naphthyl-5,11-dihydroindolo[3,2-b]carbazole; and which region has a thickness of from about 5 nanometers to about 100 nanometers;
  (iii) a mixed region situated on the hole transport region comprised of (1) from about 35 weight percent to about 65 weight percent of N,N'-di(naphthalene-1-yl)-N,N'-diphenyl-benzidine (NPB) or N,N'-bis(p-biphenyl)-N,N'-diphenyl benzidine (biphenyl TPD); (2) from about 65 weight percent to about 35 weight percent of tris(8-hydroxyquinoline) aluminum or bis(8-hydroxyquinolato)-(4-phenylphenolato) aluminum; and (3) from about 5 weight percent to about 25 weight percent of 2,3,7,8,12,13,17,18-octaethyl-21H,23H-porphine platinum (II) (PtOEP) wherein all weight percents are based on the total weight of components comprising the mixed region, and wherein the thickness of the mixed region is from about 50 nanometers to about 150 nanometers;
  (iv) an electron transport region situated on the mixed region comprising (1) a first layer of a thickness of from about 5 nanometers to about 25 nanometers contacting the mixed region wherein the first layer is comprised of tris(8-hydroxyquinoline) aluminum (Alq$_3$), bis(8-hydroxyquinolato)-(4-phenylphenolato)aluminum (Balq), 1,4-bis(4-phenylquinolin-2-yl)benzene, or 4,4'-bis(4-phenylquinolin-2-yl)-1,1'-biphenyl (TA); and (2) a second layer of a thickness of from about 5 nanometers to about 25 nanometers contacting the cathode, wherein the second layer is comprised of tris(8-hydroxyquinoline) aluminum (Alq$_3$), bis(8-hydroxyquinolato)-(4-phenylphenolato)aluminum (Balq), copper phthalocyanine (CuPc), 4,4'-bis-[2-(4,6-diphenyl-1,3,5-triazinyl)]-1,1'-biphenyl, 4,4'-bis-[2-(4,6-di-p-tolyl-1,3,5-triazinyl)]-1,1'-biphenyl, 4,4'-bis-[2-(4,6-di-m-tolyl-1,3,5-triazinyl)]-1,1'-biphenyl, 4,4'-bis-[2-(4,6-di-p-methoxyphenyl-1,3,5-triazinyl)]-1,1'-biphenyl, 4,4'-bis-[2-(4,6-di-m-methoxyphenyl-1,3,5-triazinyl)]-1,1'-biphenyl, or 2,4,6-tris(4-biphenylyl)-1,3,5-triazine;
  (v) a cathode situated on the electron transport region comprised of one of (1) a layer comprising Mg:Ag alloy or Al of a thickness of from about 50 nanometers to about 500 nanometers; and (2) a first layer comprised of from about 40 volume percent to about 55 volume percent of Mg; from about 2 volume percent to about 10 volume percent of Ag; and from about 55 volume percent to about 40 volume percent of Alq$_3$, wherein the thickness of the first layer is from about 100 nanometers to about 600 nanometers, and coated with a second layer of a thickness of from about 50 nanometers to about 500 nanometers comprising a metal or a metal alloy; and
  (vi) a thermal protective component situated on the cathode comprised of SiO, SiO$_2$ or mixtures thereof of a thickness of from about 100 nanometers to about 1,000 nanometers; an organic light emitting device comprising
    (i) an anode of indium-tin-oxide with a thickness of from about 30 to about 300 nanometers, which anode is coated on a substrate, the anode and the substrate being capable of transmitting at least about 70 percent of radiation of wavelength longer than about 400 nanometers;
    (ii) a hole transport region present on and in contact with the anode comprised of a component selected from the group consisting of N,N'-di(naphthalene-1-yl)-N,N'-diphenyl-benzidine (NPB), N,N'-bis(p-biphenyl)-N,N'-diphenyl benzidine (biphenyl TPD), 5,11-di-naphthyl-5,11-dihydroindolo[3,2-b]carbazole, and 8-dimethyl-5,11-di-naphthyl-5,11-dihydroindolo[3,2-b]carbazole; and which region further comprises a buffer layer contacting the anode, and comprised of copper phthalocyanine, wherein the thickness of the buffer layer is from about 10 nanometers to about 30 nanometers; and the thickness of the hole transport region is from about 5 nanometers to about 20 nanometers greater than the thickness of the buffer layer;
    (iii) a mixed region situated on the hole transport region comprised of (1) from about 35 weight percent to about 65 weight percent of N,N'-di(naphthalene-1-yl)-N,N'-diphenyl-benzidine (NPB) or N,N'-bis(p-biphenyl)-N,N'-diphenyl benzidine (biphenyl TPD); (2) from about 65 weight percent to about 35 weight percent of tris(8-hydroxyquinoline) aluminum or bis(8-hydroxyquinolato)-(4-phenylphenolato) aluminum; and (3) from about 5 weight percent to about 25 weight percent of 2,3,7,8,12,13,17,18-octaethyl-21H,23H-porphine platinum (II) (PtOEP), wherein all weight percentages are based on the total weight of materials comprising the mixed region, and wherein the thickness of the mixed region is from about 50 nanometers to about 150 nanometers;
    (iv) an electron transport region situated on the mixed region comprising (1) a first layer of a thickness of from about 5 nanometers to about 25 nanometers contacting the mixed region, wherein this first layer is comprised of tris(8-hydroxyquinoline) aluminum (Alq$_3$), bis(8-hydroxyquinolato)-(4-phenylphenolato) aluminum (Balq), and 1,4-bis(4-phenylquinolin-2-yl)benzene, 4,4'-bis(4-phenylquinolin-2-yl)-1,1'-biphenyl (TA); and (2) a second layer of a thickness of from about 5 nanometers to about 25 nanometers contacting the cathode, wherein the second is comprised of tris(8-hydroxyquinoline) aluminum (Alq$_3$), bis(8-hydroxyquinolato)-(4-phenylphenolato)aluminum (Balq), copper phthalocyanine (CuPc), 4,4'-bis-[2-(4,6-diphenyl-1,3,5-triazinyl)]-1,1'-biphenyl, 4,4'-bis-[2-(4,6-di-p-tolyl-1,3,5-triazinyl)]-1,1'-biphenyl, 4,4'-bis-[2-(4,6-di-m-tolyl-1,3,5-triazinyl)]-1,1'-biphenyl, 4,4'-bis-[2-(4,6-di-p-methoxyphenyl-1,3,5-triazinyl)]-1,1'-biphenyl, and 4,4'-bis-[2-(4,6-di-m-methoxyphenyl-1,3,5-triazinyl)]-1,1'-biphenyl, or 2,4,6-tris(4-biphenylyl)-1,3,5-triazine;

(v) a cathode situated on the electron transport region comprised of one of (1) a layer comprised of Mg:Ag alloy or Al of a thickness of from about 50 nanometers to about 500 nanometers; and (2) a first layer comprised of from about 40 volume percent to about 55 volume percent of Mg; from about 2 volume percent to about 10 volume percent of Ag; and from about 55 volume percent to about 40 volume percent of Alq$_3$, wherein the thickness of the first layer is from about 100 nanometers to about 600 nanometers, and coated with a second layer of a thickness of from about 50 nanometers to about 500 nanometers comprising a metal or a metal alloy; and (vi) a thermal protective element situated on the cathode comprised of SiO, SiO$_2$ or mixtures thereof of a thickness of from about 100 nanometers to about 1,000 nanometers; an organic light emitting device wherein X is oxygen, or sulfur; an organic light emitting device wherein X is an alkyl amino group wherein alkyl contains from about 1 to about 20 carbon atoms; an organic light emitting device wherein X is an aryl imino group wherein aryl contains from about 6 to about 36 carbon atoms; an organic light emitting device wherein R$_1$ and R$_2$ alkyl contain from about 1 to about 20 carbon atoms; and R$_1$ and R$_2$ aryl contain from about 6 to about 36 carbon atoms; an organic light emitting device wherein R$_3$ and R$_4$ alkyl contain from about 1 to about 20 carbon atoms; an organic light emitting device wherein R$_5$, R$_6$, R$_7$ and R$_8$ alkoxy contain from about 1 to about 20 carbon atoms and alkyl contains from about 1 to about 20 carbon atoms; an organic light emitting device wherein the protective layer is comprised of a silicon dioxide or a silicon oxide; an organic light emitting device wherein the hole transport region is present; the electron transport region is present; or the hole transport region and the electron transport region are present; an organic light emitting device wherein each of the regions comprises from about 1 to about 20 layers; an organic light emitting device wherein each of the regions comprises from about 1 to about 5 layers; an organic light emitting device wherein each of the regions is from about 1 to about 3 layers; an organic light emitting device wherein each of the regions is from about 2 to about 4 layers; an organic light emitting device wherein each of the regions is one layer; an organic light emitting device wherein the emitter amount is from about 0.1 to about 5 weight percent; an organic light emitting device wherein the red emitter amount is from about 0.2 to about 2 weight percent; an organic light emitting device wherein the M is aluminum, gallium, zinc or indium; a device comprising a first electrode, a second electrode, a region comprised of a mixture of a tertiary aromatic amine, a metal oxinoid and an emitting compound; an optional protective layer, and at least one of a hole transport region and an electron transport region, wherein one of the first and the second electrode is a cathode and wherein one is an anode; wherein the hole transport region is situated between the anode and the mixed region; wherein the electron transport region is situated between the cathode and the mixed region; wherein the light emitting compound is present in an amount of from 1 to about 40 weight percent and wherein the emitting compound is wherein X is a suitable component like a carbon C atom or a nitrogen N atom, or optionally oxygen or sulfur; R$_1$, R$_2$ and R$_3$ are each independently selected from the group consisting of hydrogen, alkyl, substituted alkyl, aryl, and substituted aryl; and M is a divalent, trivalent or tetravalent metal; and which devices possess in embodiments thereof (i) excellent and high stability, such as, for example, a half-life of, for example, about 1,000 hours from an initial luminance of 100 cd/m$^2$ at temperatures of about, for example, 80° C. to 100° C., (2) a high quantum efficiency, such as, for example, an external quantum efficiency of at least about 4 percent when operated at a luminance of 100 cd/m$^2$, and (3) an excellent color purity, such as, for example, color coordinates of about 0.679, 0.319 on the C.I.E. chart; an EL device comprised in sequence of (i) a first electrode, which can be an anode or a cathode;
(ii) a mixed region comprising a mixture of (1) a tertiary aromatic amine, (2) a metal oxinoid, and (3) a green emitting material as illustrated in copending application U.S. Ser. No. (not yet assigned—D/A1581), the disclosure of which is totally incorporated herein by reference, or a red emitting material encompassed by Formula I wherein, for example, X is a C atom or an N atom; $R_1$, $R_2$ and $R_3$ are each independently selected from the group consisting of hydrogen; alkyl; aryl; with substituents of, for example, recognized donor and acceptor groups wherein $R_1$ and $R_2$ may be combined together to form a fused ring; and M is a divalent, trivalent or tetravalent metal;

(iii) a second electrode, which can be a cathode or an anode;

(iv) a thermal protective layer coated on one of the first and second electrodes, wherein one of the first and second electrodes is a hole injection anode, and one of the electrodes is an electron injection cathode, and wherein the organic light emitting device further comprises at least one of (v) a hole transport region interposed between the anode and the mixed region, wherein the hole transport region optionally includes a buffer layer; and (vi) an electron transport region interposed between the cathode and the mixed region, wherein region throughout refers to at least one layer, and more specifically, from one to about 10 layers; and an EL device where the tertiary aromatic amine is N,N'-di(naphthalene-1-yl)-N,N'-diphenyl-benzidine (NPB) or N,N'-bis(p-biphenyl)-N,N'-diphenyl benzidine (biphenyl TPD) and the metal oxinoid is tris(8-hydroxyquinoline) aluminum ($AlQ_3$).

The organic light emitting devices can be utilized in various devices, such as displays, that typically are operated over a broad range of temperature conditions. The operational stability at high temperature conditions provided by the organic light emitting devices of this invention enables in embodiments thereof use at high temperature applications for extended periods of time. In addition, the organic light emitting devices of the present invention can provide red emission with increased efficiency and excellent color purity.

BRIEF DESCRIPTION OF THE DRAWINGS

In each of the Figures, "region" refers to one layer, and the Figure descriptions herein refer to embodiments of the present invention, thus for example, in this application and related copending applications filed concurrently herewith, the regions, layers, and components thereof can possess thickness not specifically recited and components not specifically recited.

DETAILED DESCRIPTION OF EMBODIMENTS

The organic light emitting devices according to the embodiments of this invention comprise (i) an anode;

(ii) a mixed region, which region can be a single layer or a number of layers (typically 2 or 3) laminated on each other, each of a thickness of from about 5 nanometers to about 5,000 nanometers, and comprising a mixture of (1) a tertiary aromatic amine, (2) a metal oxinoid, and (3) a red emitting material or compound of the formula illustrated herein Formula I

(iii) a second electrode of a cathode;

(iv) a thermal protective component coated on one of the anode and cathode, or coated on both the anode and cathode, and wherein the organic light emitting device further comprises at least one of (v) a hole transport region situated between the anode and the mixed region; and (vi) an electron transport region interposed between the cathode and the mixed region, and wherein the hole transport region and the electron transport region are believed to achieve a more balanced charge injection process, and reduce leakage of the carriers to the counterelectrodes, reference Z. D. Popovic et al., *Proceedings of the SPIE*, Vol. 3176, "Organic Light-Emitting Materials and Devices II," San Diego, Calif., Jul. 21–23, 1998, pp. 68–73, the disclosure of which is totally incorporated herein by reference, and therefore, demonstrate higher efficiency compared to a number of organic light emitting devices of the prior art, such as, for example, a number of the organic light emitting devices of U.S. Pat. Nos. 5,853,905; 5,925,980; 6,114,055; and 6,130,001; an EL device comprised of (i) a hole transport layer or layers situated between anode and mixed region; and (ii) an electron transport layer or layers between the cathode and the mixed region, reference for example the organic light emitting device 10 illustrated in FIG. 1 comprising a first electrode 12 serving as a hole injecting anode; laminated on the first electrode 12 is a hole transport region 13 which may optionally include a buffer layer; laminated on the hole transport region 13 is a mixed region 14 comprising a mixture of (1) a tertiary aromatic amine, (2) a metal oxinoid, and (3) a red emitting material of Formula I illustrated herein such as PtOEP 2,3,7,8,12,13,17,18-octaethyl-21H,23H-porphine platinum (II) (PtOEP); laminated on the mixed region layer or layers 14 is an electron transport region layer or layers 15; laminated on the electron transport region layer or layers 15 is a second electrode 16 serving as an electron injecting electrode; and an EL device comprising only one of the hole transport region and the electron transport region, that is, in embodiments comprised of a hole transport region between the anode and the mixed region with no electron transport region between the mixed region and the cathode, and which mixed region is in contact with the cathode; or an electron transport region between the mixed region and the cathode with no hole transport region between the anode and the mixed region, the mixed region being in contact with the anode; and an organic light emitting device comprised of a hole transport region with no electron transport region.

Figure 2:
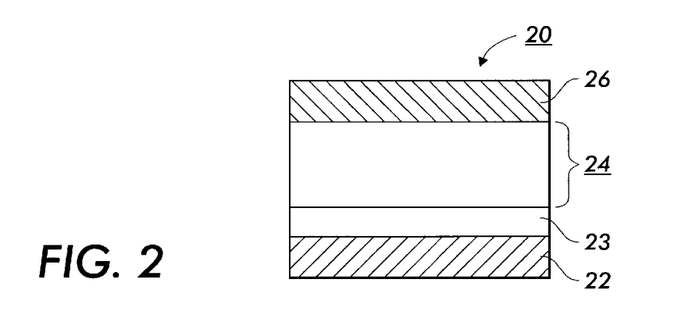
FIG. 2 illustrates another organic light emitting device.
Figure 3:
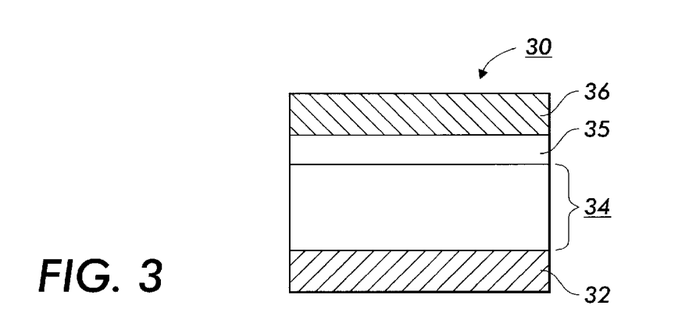
FIG. 3 illustrates yet another organic light emitting device.

Illustrated in FIG. 2 is an EL device 20 comprised of a first electrode 22 serving as a hole injecting anode; laminated on the first electrode 22 is a hole transport region 23, which optionally may include a buffer layer; laminated on the hole transport region 23 is a mixed region 24 comprising a mixture of (1) a tertiary aromatic amine, (2) a metal oxinoid, and (3) a red emitting material of Formula I, such as, 2,3,7,8,12,13,17,18-octaethyl-21H,23H-porphine platinum (II) (PtOEP); and laminated on the mixed region 24 is a second electrode 26 serving as an electron injecting electrode. FIG. 3 illustrates an organic light emitting device 30 comprised of a first electrode 32 serving as a hole injecting anode; laminated on the first electrode 32 is a mixed region 34 comprising a mixture of (1) a tertiary aromatic amine, (2) a metal oxinoid, and (3) a red emitting material of the Formula I, such as, 2,3,7,8,12,13,17,18-octaethyl-21H,23H-porphine platinum (II) (PtOEP); laminated on the mixed region 34 is an electron transport zone 35; and laminated on the electron transport zone is a second electrode 36 serving as an electron injecting electrode.

Figure 1:
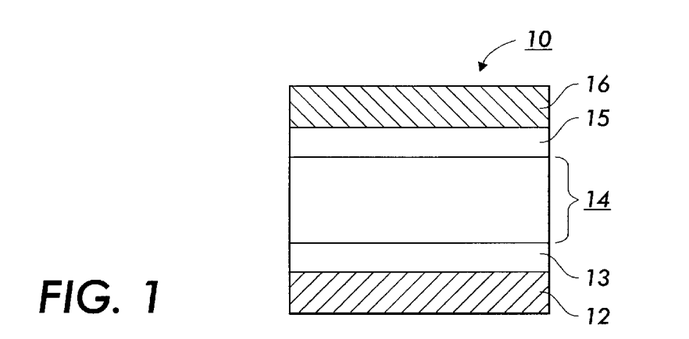
FIG. 1 illustrates an organic light emitting device.

With further reference to the Figures, the organic light emitting devices can be comprised of both (i) a hole transport region situated between the anode and the mixed region; and (ii) an electron transport region situated between the cathode and the mixed region, and wherein the tertiary aromatic amine is N,N'-di(naphthalene-1-yl)-N,N'-diphenyl-benzidine (NPB) or N,N'-bis(p-biphenyl)-N,N'-diphenyl benzidine (biphenyl TPD), and the metal oxinoid is tris(8-hydroxyquinoline) aluminum (AlQ3); the EL device can contain a thermal protective layer as illustrated in U.S. Ser. Nos. 09/770,159 and 09/770,154, the disclosures of which are totally incorporated herein by reference, which layer can be laminated on the first electrodes 12, 22, 32 or on the second electrodes 16, 26, 36; an EL device wherein at least one of the hole transport regions 13, 23 between the anodes 12, 22 and the mixed regions 14, 24 and the electron transport regions 15, 35 between the mixed regions 14, 34 and the cathodes 16, 26 comprises a plurality of separate layers, wherein the number of individual layers of the hole transport regions 13, 23 and the electron transport regions 15, 35 can be selectively varied. Typically, in such embodiments, the number of layers of either of these regions is from 1 to about 10, and more specifically, from about 2 to about 3.

The hole transport component comprising the mixed regions of 14, 24 and the hole transport component comprising the hole transport region, for example 13, 23 can be the same material, or different materials, reference the materials of copending patent application U.S. Ser. No. (not yet assigned—D/A1251), filed concurrently herewith, the disclosure of which is totally incorporated herein by reference, and wherein the use of different hole transport components in the mixed regions 14, 24 and the hole transport regions 13, 23 can result in desirable device characteristics, such as, for example, an increase of the stability of the device in the form of increasing the half-life or reducing the increase in the driving voltage of the organic light emitting devices 10, 20. In addition, the hole transport components used in the different layers of the multiple-layer hole transport region can be different or similar; similarly, the electron transport component comprising the mixed regions 14, 34 and the electron transport component comprising the electron transport regions 15, 35 can be the same material, or different materials, reference the components of copending patent application U.S. Ser. No. (not yet assigned—D/A1251), filed concurrently herewith, the disclosure of which is totally incorporated herein by reference, the use of different electron transport components in the mixed region 14, 34 and the electron transport regions 15, 35 can result in desirable features, such as, for example, increase of the efficiency of the organic light emitting device 10, 30; also the electron transport components used in the different layers of the multiple-layer electron transport region can be different or similar.

The hole transport regions 13, 23 can include a layer comprising a mixture of a phthalocyanine and a hole transport component, such as, for example, a tertiary aromatic amine or an indolocarbazole, and wherein the hole transport region can be formed of a layer comprising a mixture of a porphyrin, such as, for example, copper phthalocyanine (CuPc), and a hole transport component, such as for example, an indolocarbazole, such as, for example, 5,11-di-naphthyl-5,11-dihydroindolo[3,2-b]carbazole, 2,8-dimethyl-5,11-di-naphthyl-5,11-dihydroindolo[3,2-b] carbazole; or a tertiary aromatic amine, such as, for example, di(naphthalene-1-yl)-N,N'-diphenyl-benzidine (NPB) or N,N'-bis(p-biphenyl)-N,N'-diphenyl benzidine (biphenyl TPD).

The cathode 16 of the organic light emitting device comprises a metal-organic mixed region including (i) a metal first component (such as, for example, Mg); (ii) an organic material second component (such as, for example, $AlQ_3$); and (iii) at least one third component selected from the group consisting of metals, organic materials and inorganic materials (such as, for example Ag, reference copending patent application U.S. Ser. No. 09/800,716, and these embodiments can result in a number of desirable properties, such as, an increased contrast, better visibility and higher environmental stability of displays utilizing organic light emitting devices.

The organic light emitting devices can be operated under alternating current (AC) and/or direct current (DC) driving conditions. AC driving conditions provide extended operational lifetimes, especially in high temperature device operation conditions; operating voltage includes, for example, from about 3 to about 20 volts, and more specifically, from about 5 to about 15 volts; driving current values include, for example, from about 1 to about 1,000 mA/cm$^2$ density, and more specifically, from about 10 mA/cm$^2$ to about 200 mA/cm$^2$.

The anodes 12, 22, and 32 can comprise a suitable positive charge injecting electrodes such as indium tin oxide (ITO), silicon, tin oxide, gold and platinum. Other suitable materials for the anode include, but are not limited to, electrically conductive carbon, π-conjugated polymers, such as polyaniline, polythiophene, polypyrrole, and the like having, for example, a work function equal to, or greater than, about 4 eV, and more specifically, from about 4 eV to about 6 eV.

The anodes 12, 22, and 32 can be of any suitable form, and thin conductive layer can be coated onto a light transmissive substrate, for example a transparent or substantially transparent glass plate or plastic film, for example the anode can comprise a light transmissive anode formed from tin oxide or indium tin oxide (ITO) coated on a glass plate. Also, very thin light-transparent metallic anodes having a thickness, for example, of less than about 200 Å, and, preferably, from about 75 Å to about 150 Å can be selected. These thin anodes can comprise metals such as gold, palladium and the like. In addition, transparent or semi-transparent thin layers of conductive carbon or conjugated polymers, such as polyaniline, polythiophene, polypyrrole and the like, having a thickness of, for example, from about 50 Å to about 175 Å can be selected as anodes. Additional suitable forms of the anodes 12, 22, and 32, and the cathodes 16, 26, and 36 are disclosed in U.S. Pat. No. 4,885,211, the disclosure of which is totally incorporated herein by reference.

The thickness of the anodes 12, 22, 32 can range from about 1 nanometers to about 5,000 nanometers with the preferred range depending on the optical constants of the anode material. One specific range of thickness of the anode is from about 30 nanometers to about 300 nanometers. Thicknesses outside of this range can also be used.

The hole transport components used to form the hole transport regions 13, 23 on the anodes 12, 22 can be any suitable known or later developed material. Suitable hole transport components include, but are not limited to, conductive materials such as polyaniline and its acid-doped forms, polypyrrole, poly(phenylene vinylene), and known semiconductive organic materials; porphyrin derivatives such as 1,10,15,20-tetraphenyl-21H,23H-porphyrin copper (II) disclosed in U.S. Pat. No. 4,356,429, the disclosure of which is totally incorporated herein by reference; copper phthalocyanine, copper tetramethyl phthalocyanine; zinc phthalocyanine; titanium oxide phthalocyanine; magnesium phthalocyanine; and the like. Mixtures of these and other suitable materials can also be used. A specific class of hole transporting materials are the aromatic tertiary amines such as those disclosed in U.S. Pat. Nos. 4,539,507; 4,720,432 and 5,061,569, the disclosures of which are totally incorporated herein by reference. Suitable exemplary aromatic tertiary amines include, but are not limited to, bis(4-dimethylamino-2-methylphenyl)phenylmethane, N,N,N-tri (p-tolyl)amine, 1,1-bis(4-di-p-tolylaminophenyl) cyclohexane, 1,1-bis(4-di-p-tolylaminophenyl)-4-phenyl cyclohexane, N,N'-diphenyl-N,N'-bis(3-methylphenyl)-1,1'-biphenyl-4,4'-diamine, N,N'-diphenyl-N,N'-bis(3-methylphenyl)-1,1'-biphenyl4,4'-diamine, N,N'-diphenyl-N, N'-bis(4-methoxyphenyl)-1,1'-biphenyl4,4'-diamine, N,N, N', N'-tetra-p-tolyl-1,1'-biphenyl4,4'-diamine, N,N'-di-1-naphthyl-N,N'-diphenyl-1,1'-biphenyl-4,4'-diamine. Other illustrative examples of tertiary aromatic amines are N,N, N',N'-tetraarylbenzidines, wherein aryl may be selected from phenyl, m-tolyl, p-tolyl, m-methoxyphenyl, p-methoxyphenyl, 1-naphthyl, 2-naphthyl and the like. Illustrative examples of N,N,N',N'-tetraarylbenzidine are, more specifically, N,N-di-1-naphthyl-N,N'-diphenyl-1,1'-biphenyl4,4'-diamine; N,N'-bis(3-methylphenyl)-N,N'-diphenyl-1,1'-biphenyl-4,4'-diamine; N,N'-bis(3-methoxyphenyl)-N,N'-diphenyl-1,1'-biphenyl-4,4'-diamine, and the like. More specifically, hole transport components also include N,N'-di(naphthalene-1-yl)-N,N'-diphenyl-benzidine (NPB), N,N'-bis(p-biphenyl)-N,N'-diphenyl benzidine (biphenyl TPD) and derivatives thereof; polynuclear aromatic amines, such as polynuclear aromatic amines include, but are not limited to, N,N-bis-[4'-(N-phenyl-N-m-tolylamino)-4-biphenylyl]aniline; N,N-bis-[4'-(N-phenyl-N-m-tolylamino)-4-biphenylyl]-m-toluidine; N,N-bis-[4'-(N-phenyl-N-m-tolylamino)-4-biphenylyl]-p-toluidine; N,N-bis-[4'-(N-phenyl-N-p-tolylamino)4-biphenylyl] aniline; N,N-bis-[4'-(N-phenyl-N-p-tolylamino)-4-biphenylyl]-m-toluidine; N,N-bis-[4'-(N-phenyl-N-p-tolylamino)-4-biphenylyl]-p-toluidine; N,N-bis-[4'-(N-phenyl-N-p-chlorophenylamino)-4-biphenylyl]-m-toluidine; N,N-bis-[4'-(N-phenyl-N-m-chlorophenylamino)-4-biphenylyl]-m-toluidine; N,N-bis-[4'-(N-phenyl-N-m-chlorophenylamino)-4-biphenylyl]-p-toluidine; N,N-bis-[4'-(N-phenyl-N-m-tolylamino)-4-biphenylyl]-p-chloroaniline; N,N-bis-[4'-(N-phenyl-N-p-tolylamino)-4-biphenylyl]-m-chloroaniline; N,N-bis-[4'-(N-phenyl-N-m-tolylamino)-4-biphenylyl]-1-aminonaphthalene, mixtures thereof and the like; 4,4'-bis(9-carbazolyl)-1,1'-biphenyl compounds. Illustrative examples of 4,4'-bis(9-carbazolyl)-1,1'-biphenyl compounds include 4,4'-bis(9-carbazolyl)-1,1'-biphenyl and 4,4'-bis(3-methyl-9-carbazolyl)-1,1'-biphenyl, and the like, with a preferred class of the hole transport components being the indolo-carabazoles, such as those described in U.S. Pat. Nos. 5,942,340 and 5,952,115, the disclosures of which are totally incorporated herein by reference, such as, for example, 5,11-di-naphthyl-5,11-dihydroindolo[3,2-b] carbazole and 2,8-dimethyl-5,11-di-naphthyl-5,11-dihydroindolo[3,2-b]carbazole; N,N,N',N'-tetraarylbenzidines, wherein aryl may be selected from phenyl, m-tolyl, p-tolyl, m-methoxyphenyl, p-methoxyphenyl, 1-naphthyl, 2-naphthyl and the like. Illustrative examples of N,N,N',N'-tetraarylbenzidine are N,N'-di-1-naphthyl-N,N'-diphenyl-1,1'-biphenyl4,4'-diamine, which is more preferred; N,N'-bis(3-methylphenyl)-N,N'-diphenyl-1,1'-biphenyl-4,4'-diamine; N,N'-bis(3-methoxyphenyl)-N,N'-diphenyl-1,1'-biphenyl-4,4'-diamine, and the like.

The hole transport regions 13, 23 can further comprise an optional buffer layer comprised of a material with certain hole injection and transport properties and selected such that device performance is improved. Suitable components that can be utilized in the buffer layer include semiconductive organic materials; such as, for example, porphyrin derivatives like 1,10,15,20-tetraphenyl-21H,23H-porphyrin copper (II) disclosed in U.S. Pat. No. 4,356,429, the disclosure of which is totally incorporated herein by reference; copper phthalocyanine, copper tetramethyl phthalocyanine; zinc phthalocyanine; titanium oxide phthalocyanine; magnesium phthalocyanine; metal oxides like MgO, Al$_2$O$_3$, BeO, BaO, AgO, SrO, SiO, $SiO_2$, $ZrO_2$, CaO, $Cs_2O$, $Rb_2O$, $Li_2O$, $K_2O$ and $Na_2O$; and metal halides, like LiF, KCl, NaCl, CsCl, CsF and KF.

In more specific embodiments, the hole transport regions 13, 23 includes a layer comprising a mixture of a porphyrin and a hole transport component, such as, for example, a tertiary aromatic amine or an indolocarbazole, and wherein in these embodiments, the hole transport region is comprised of a layer comprising a mixture of a porphyrin, such as, for example, copper phthalocyanine (CuPc), and a hole transport component, such as for example, an indolocarbazole, or a tertiary aromatic amine, such as, for example, di(naphthalene-1-yl)-N,N'-diphenyl-benzidine (NPB) or N,N'-bis(p-biphenyl)-N,N'-diphenyl benzidine (biphenyl TPD). The hole transport regions 13, 23 including the optional buffer layer can be prepared by forming, for example, one of the above-described materials into thin films by any suitable known or later developed method. Suitable methods for this purpose include, for example, vapor deposition and spin-coating techniques.

The optional buffer layer can be located at any position within the hole transport regions 13, 23, that is, it can be located such that one surface of the optional buffer layer coincides with one surface of the hole transport regions 13, 23 wherein the optional buffer layer is contacting either the anodes 12, 22 or the mixed regions 14, 24; or it can be located such that the two surfaces of the buffer layer are in between the two surfaces of the hole transport regions 13, 23. However, in preferred embodiments, the buffer layer is located in contact with the anodes 12, 22.

The hole transport regions 13, 23, including the optional buffer layer, can have a thickness of from about 5 nanometers to about 500 nanometers; the buffer layer can have a thickness of from about 1 nanometer to about 100 nanometers; and in embodiments, the thickness of the optional buffer layer is at least 1 nanometer less than the thickness of the hole transport regions 13, 23. A specific thickness for the optional buffer layer is from about 5 nanometers to about 25 nanometers. Another specific thickness range for the optional buffer layer is from about 1 nanometer to about 5 nanometers. A thickness outside of these ranges can also be used, and in general, reducing the thickness of the hole transport regions 13, 23 without reducing the thickness of the buffer layer in it can lead to a desirable increase in device stability and, at the same time, to an undesirable decrease in device efficiency. There is, therefore, a more desirable thickness range for the hole transport regions 13, 23 for a particular thickness of the optional buffer layer in that region. A more specific thickness range for the hole transport region exclusive of the thickness of the optional buffer layer (i.e. the remaining thickness of the hole transport region after the thickness of the buffer layer is subtracted) is from about 5 nanometers to about 15 nanometers. Another more specific thickness range for the hole transport region exclusive of the thickness of the optional buffer layer is from about 15 nanometers to about 75 nanometers. Of course, a thickness outside of these ranges can also be used.

The mixed regions 14, 24, 34 formed on the hole transport regions 13, 23 or the anode 32 can comprise from about 20 weight percent to about 80 weight percent of a tertiary aromatic amine hole transport component as a first component; from about 80 weight percent to about 20 weight percent of a metal oxinoid electron transport component as a second component; and from about 0.01 weight percent to about 40 weight percent a red emitting material of Formula I as a third component, where all weight percentages are based on the total weight of materials comprising the mixed region; or wherein the mixed regions 14, 24, 34 comprise from about 35 weight percent to about 65 weight percent of a tertiary aromatic amine hole transport component as a first component; from about 65 weight percent to about 35 weight percent of a metal oxinoid as a second component; and from about 3 weight percent to about 30, about 5 to about 25, about 10 to about 12 weight percent of a red emitting material of the Formula I as a third component.

In embodiments of the organic light emitting devices according to this invention, the mixed regions 14, 24, 34 can comprise more than one layer. For example, the mixed regions 14, 24, 34 can selectively be formed to include two, three or even more separate layers. In such embodiments, the mixing ratios of the hole transport component, the electron transport component, or the red emitting compound, can be the same in each of the layers, or the mixing ratios can be varied in the layers. For example, the multiple layers can each comprise an equal weight percentage of the hole transport component and the electron transport component. In other embodiments, the mixed region can comprise different amounts of these materials.

Illustrative examples of aromatic tertiary amines that can be used in the mixed region 14, 24, 34 can be selected from those disclosed in U.S. Pat. Nos. 4,539,507; 4,720,432 and 5,061,569, the disclosures of which are totally incorporated herein by reference. Suitable exemplary aromatic tertiary amines include, but are not limited to, N,N'-di(naphthalene-1-yl)-N,N'-diphenyl-benzidine (NPB), N,N'-bis(p-biphenyl)-N,N'-diphenyl benzidine (biphenyl TPD), bis(4-dimethylamino-2-methylphenyl)phenylmethane, N,N,N-tri(p-tolyl)amine, 1,1-bis(4-di-p-tolylaminophenyl) cyclohexane, 1,1-bis(4-di-p-tolylaminophenyl)-4-phenyl cyclohexane, N,N'-diphenyl-N,N'-bis(3-methylphenyl)-1,1'-biphenyl4,4'-diamine, N,N'-diphenyl-N,N'-bis(3-methylphenyl)-1,1'-biphenyl4,4'-diamine, N,N'-diphenyl-N,N'-bis(4-methoxyphenyl)-1,1'-biphenyl4,4'-diamine, N,N,N', N'-tetra-p-tolyl-1,1'-biphenyl-4,4'-diamine, N,N'-di-1-naphthyl-N,N'-diphenyl-1,1'-biphenyl4,4'-diamine, naphthyl-substituted benzidine derivatives. Other illustrative examples of tertiary aromatic amines include N,N,N', N'-tetraarylbenzidines, wherein aryl may be selected from phenyl, m-tolyl, p-tolyl, m-methoxyphenyl, p-methoxyphenyl, 1-naphthyl, 2-naphthyl and the like. Illustrative examples of N,N,N',N'-tetraarylbenzidine are N,N'-di-1-naphthyl-N,N'-diphenyl-1,1'-biphenyl-4,4'-diamine, which is more specific; N,N'-bis(3-methylphenyl)-N,N'-diphenyl-1,1'-biphenyl-4,4'-diamine; N,N'-bis(3-methoxyphenyl)-N,N'-diphenyl-1,1'-biphenyl-4,4'-diamine, and the like. Preferred hole transport components also include the naphthyl-substituted benzidine derivatives, mixtures thereof and the like.

Illustrative examples of the metal oxinoids that can be used in the mixed regions 14, 24, and 34 include, but are not limited to, the metal oxinoid compounds as disclosed in U.S. Pat. Nos. 4,539,507; 5,151,629; 5,150,006; 5,141,671, and 5,846,666, the disclosures of which are totally incorporated herein by reference. Illustrative examples include tris(8-hydroxyquinolinate) aluminum ($Alq_3$), which is one more specific example, and bis(8-hydroxyquinolato)-(4-phenylphenolato) aluminum (BAlq), which is another more specific example. Other examples of this class of materials include tris(8-hydroxyquinolinate) gallium, bis(8-hydroxyquinolinate) magnesium, bis(8-hydroxyquinolinate) zinc, tris(5-methyl-8-hydroxyquinolinate) aluminum, tris(7-propyl-8-quinolinolato) aluminum, bis[benzo{f}-8-quinolinate]zinc, bis(10-hydroxybenzo[h]quinolinate) beryllium, and the like, and metal thioxinoid compounds illustrated in U.S. Pat. No. 5,846,666, the disclosure of which is totally incorporated herein by reference, such as metal thioxinoid compounds of bis(8-quinolinethiolato)zinc, bis(8-quinolinethiolato)cadmium, tris(8-quinolinethiolato) gallium, tris(8-quinolinethiolato)indium, bis(5-methylquinolinethiolato)zinc, tris(5-methylquinolinethiolato)gallium, tris(5-methylquinolinethiolato)indium, bis(5-methylquinolinethiolato)cadmium, bis(3-methylquinolinethiolato)cadmium, bis(5-methylquinolinethiolato)zinc, bis[benzo{f}-8-quinolinethiolato]zinc, bis[3-methylbenzo{f}-8-quinolinethiolato]zinc, bis[3,7-dimethylbenzo{f}-8-quinolinethiolato]zinc, and the like. Preferred materials are bis(8-quinolinethiolato)zinc, bis(8-quinolinethiolato) cadmium, tris(8-quinolinethiolato)gallium, tris(8-quinolinethiolato)indium and bis[benzo{f}-8-quinolinethiolato]zinc.

The mixed regions 14, 24, 34 can have a thickness of from about 10 nanometers to about 2,000 nanometers. Preferably, the mixed regions 14, 24, 34 can have a thickness ranging from about 50 nanometers to about 200 nanometers. A thickness outside of these ranges can also be used. Reducing the thickness of the mixed regions 14, 24, 34 can result in a desirable decrease in the operational voltage of the organic light emitting device, but in the same time, leads to an undesirable decrease the luminance (and EL efficiency) of the organic light emitting device of this invention. The mixed regions 14, 24, 34 can be formed by any suitable method that enables the formation of selected mixtures of the hole transport components, electron transport components and the red emitting material. For example, the mixed regions 14, 24, 34 can be formed by coevaporating the hole transport components, electron transport components, and the red emitting material.

The electron transport components used to form the electron transport regions 15, 35 on the mixed regions 14, 34 can be any suitable known or later developed material. Suitable electron transport components include, but are not limited to, conductive materials such as metal oxinoids. Illustrative examples of metal oxinoids that can be utilized in the electron transport regions 15, 35 include, but are not limited to, the metal chelates of 8-hydroxyquinoline as disclosed in U.S. Pat. Nos. 4,539,507; 5,151,629; 5,150,006 and 5,141,671, the disclosures of which are totally incorporated herein by reference. Illustrative examples include tris(8-hydroxyquinolinate) aluminum ($Alq_3$), which is a preferred electron transport component. Another preferred example is bis(8-hydroxyquinolato)-(4-phenylphenolato) aluminum (Balq). Other examples include tris(8-hydroxyquinolinate) gallium, bis(8-hydroxyquinolinate) magnesium, bis(8-hydroxyquinolinate) zinc, tris(5-methyl-8-hydroxyquinolinate) aluminum, tris(7-propyl-8-quinolinolato) aluminum, bis[benzo{f}-8-quinolinate]zinc, bis(10-hydroxybenzo[h]quinolinate) beryllium, and the like; stilbene derivatives, such as those disclosed in U.S. Pat. No. 5,516,577, the disclosure of which is totally incorporated herein by reference, like 4,4'-bis(2,2-diphenylvinyl) biphenyl; the metal thioxinoid compounds, illustrated in U.S. Pat. No. 5,846,666, the disclosure of which is totally incorporated herein by reference, like bis(8-quinolinethiolato)zinc, bis(8-quinolinethiolato)cadmium, tris(8-quinolinethiolato)gallium, tris(8-quinolinethiolato) indium, bis(5-methylquinolinethiolato)zinc, tris(5-methylquinolinethiolato)gallium, tris(5-methylquinolinethiolato)indium, bis(5-methylquinolinethiolato)cadmium, bis(3-methylquinolinethiolato)cadmium, bis(5-methylquinolinethiolato)zinc, bis[benzo{f}-8-quinolinethiolato]zinc, bis[3-methylbenzo{f}-8-quinolinethiolato]zinc, bis[3,7-dimethylbenzo{f}-8-quinolinethiolato]zinc, and the like. More specific materials are bis(8-quinolinethiolato)zinc, bis(8-quinolinethiolato) cadmium, tris(8-quinolinethiolato)gallium, tris(8-quinolinethiolato)indium and bis[benzo{f}-8-quinolinethiolato]zinc; the oxadiazole metal chelates disclosed in incorporated U.S. Pat. No. 5,925,472; bis[2-(2-hydroxyphenyl)-5-phenyl-1,3,4-oxadiazolato]zinc; bis[2-(2-hydroxyphenyl)-5-phenyl-1,3,4-oxadiazolato]beryllium; bis[2-(2-hydroxyphenyl)-5-(1-naphthyl)-1,3,4-oxadiazolato]zinc; bis[2-(2-hydroxyphenyl)-5-(1-naphthyl)-1,3,4-oxadiazolato]beryllium; bis[5-biphenyl-2-(2-hydroxyphenyl)-1,3,4-oxadiazolato]zinc; bis[5-biphenyl-2-(2-hydroxyphenyl)-1,3,4-oxadiazolato]beryllium; bis(2-hydroxyphenyl)-5-phenyl-1,3,4-oxadiazolato]lithium; bis[2-(2-hydroxyphenyl)-5-p-tolyl-1,3,4-oxadiazolato]zinc; bis[2-(2-hydroxyphenyl)-5-p-tolyl-1,3,4-oxadiazolato] beryllium; bis[5-(p-tert-butylphenyl)-2-(2-hydroxyphenyl)-1,3,4-oxadiazolato]zinc; bis[5-(p-tert-butylphenyl)-2-(2-hydroxyphenyl)-1,3,4-oxadiazolato]beryllium; bis[2-(2-hydroxyphenyl)-5-(3-fluorophenyl)-1,3,4-oxadiazolato] zinc; bis[2-(2-hydroxyphenyl)-5-(4-fluorophenyl)-1,3,4-oxadiazolato]zinc; bis[2-(2-hydroxyphenyl)-5-(4-fluorophenyl)-1,3,4-oxadiazolato]beryllium; bis[5-(4-chlorophenyl)-2-(2-hydroxyphenyl)-1,3,4-oxadiazolato] zinc; bis[2-(2-hydroxyphenyl)-5-(4-methoxyphenyl)-1,3,4-oxadiazolato]zinc; bis[2-(2-hydroxy-4-methylphenyl)-5-phenyl-1,3,4-oxadiazolato]zinc; bis[2-α-(2-hydroxynaphthyl)-5-phenyl-1,3,4-oxadiazolato]zinc; bis[2-(2-hydroxyphenyl)-5-p-pyridyl-1,3,4-oxadiazolato]zinc; bis[2-(2-hydroxyphenyl)-5-p-pyridyl-1,3,4-oxadiazolato] beryllium; bis[2-(2-hydroxyphenyl)-5-(2-thiophenyl)-1,3,4-oxadiazolato]zinc; bis[2-(2-hydroxyphenyl)-5-phenyl-1,3,4-thiadiazolato]zinc; bis[2-(2-hydroxyphenyl)-5-phenyl-1,3,4-thiadiazolato]beryllium; bis[2-(2-hydroxyphenyl)-5-(1-naphthyl)-1,3,4-thiadiazolato]zinc; and bis[2-(2-hydroxyphenyl)-5-(1-naphthyl)-1,3,4-thiadiazolato] beryllium, and the like; the quinolines, such as, for example, 1,4-bis(4-phenylquinolin-2-yl)benzene, 4,4'-bis(4-phenylquinolin-2-yl)-1,1'-biphenyl (TA); the triazines as described in U.S. Pat. No. 6,057,048 and U.S. Pat. No. 6,229,012, the disclosures of which are incorporated herein by reference, such as, for example, 4,4'-bis-[2-(4,6-diphenyl-1,3,5-triazinyl)]-1,1'-biphenyl, 4,4'-bis-[2-(4,6-di-p-tolyl-1,3,5-triazinyl)]-1,1'-biphenyl, 4,4'-bis-[2-(4,6-di-m-tolyl-1,3,5-triazinyl)]-1,1'-biphenyl, 4,4'-bis-[2-(4,6-di-p-methoxyphenyl-1,3,5-triazinyl)]-1,1'-biphenyl, 4,4'-bis-[2-(4,6-di-m-methoxyphenyl-1,3,5-triazinyl)]-1,1'-biphenyl, 2,4,6-tris(4-biphenylyl)-1,3,5-triazine, and the like.

The electron transport regions 15, 35 can be of a thickness of from about 1 nanometer to about 100 nanometers, or from about 5 nanometers to about 50 nanometers. In embodiments where the organic light emitting devices comprise a multiple-layered electron transport region 15, 35, the individual layers have a thickness of at least about 1 nanometer.

The cathodes 16, 26, 36 formed, for example, on the electron transport regions 15, 35 or the mixed region 24 can comprise suitable electron injecting materials, such as metals, including high work function components, such as metals with, for example, a work function from about 4 eV to about 6 eV, or low work function components, such as metals with, for example, a work function of from about 2 eV to about 4 eV. The cathodes 16, 26, 36 can comprise a combination of a low work function (less than about 4 eV)

metal and at least one other metal. Effective proportions of the low work function metal to the second or other metal are from less than about 0.1 weight percent to about 99.9 weight percent. Illustrative examples of low work function metals include, but are not limited to, alkaline metals such as lithium or sodium; Group 2A or alkaline earth metals such as beryllium, magnesium, calcium or barium; and Group III metals including rare earth metals and the actinide group metals such as scandium, yttrium, lanthanum, cerium, europium, terbium or actinium. Lithium, magnesium and calcium are preferred low work function metals. The Mg—Ag alloy cathodes described in U.S. Pat. Nos. 4,885,211 and 4,720,432, the disclosures of which are totally incorporated herein by reference, are more specific cathode materials for forming the cathodes 16, 26, 36. Other more specific cathodes are described in copending patent application U.S. Ser. No. 09/800,716, the disclosure of which is totally incorporated herein by reference, and comprise a metal-organic mixed region including (i) a metal first component (such as, for example, Mg); (ii) an organic material second component (such as, for example, $AlQ_3$); and (iii) at least one third component selected from the group consisting of metals, organic materials and inorganic materials (such as, for example, Ag). Other preferred cathodes are described in U.S. Pat. No. 5,429,884, which is totally incorporated herein by reference. These cathodes are formed from lithium alloys with other high work function metals such as aluminum and indium.

The cathodes 16, 26, 36 can also include an electron injection layer in contact with the electron transport regions 15, 35 or the mixed region 24 of, for example, an insulative material such as an oxide material or an alkaline metal compound as described in U.S. Pat. Nos. 5,457,565; 5,608,287 and 5,739,635, which disclosures are each totally incorporated herein by reference. The thickness of the cathodes 16, 26, 36 can range from, for example, about 10 nanometers to about 1,000 nanometers; thicknesses outside of this range can also be used.

In embodiments, a thermal protective element can optionally be formed on the cathodes 16, 26, 36 or on the anodes 12, 22, 32. Examples of thermal protective elements are disclosed in more detail in copending applications U.S. Ser. Nos. 09/770,154 and 09/770,159, the disclosures of which are incorporated herein by reference. Typically, the thermal protective element is comprises a layer comprised of SiO, $SiO_2$ and/or mixtures thereof, and with a thickness ranging from about 300 nanometers to about 5,000 nanometers.

The following Examples are provided to further illustrate various aspects of the present invention. With respect to the Examples that follow, "region" refers to one layer.

EXAMPLE I

An organic light emitting device having a structure, such as device 10 in FIG. 1, was formed and evaluated. In this device a naphthyl-substituted benzidine derivative N,N'-di-1-naphthyl-N,N'-diphenyl-1,1'-biphenyl-4,4'-diamine (NPB), and tris(8-hydroxyquinoline) aluminum ($Alq_3$) were selected as the hole transport component and the electron transport component, respectively, comprising the hole transport region, the mixed region 14, and the electron transport region 15 in the organic light emitting device 10. The mixed region 14 was comprised of about 44 weight percent of NPB; about 44 weight percent of $Alq_3$ and about 12 weight percent of 2,3,7,8,12,13,17,18-octaethyl-21H, 23H-porphine platinum (II) (PtOEP). Copper phthalocyanine (CuPc) was used to form a buffer layer in the hole transport region 13, and where the buffer layer was contacting the anode 12. The thickness of the buffer layer was about 15 nanometers, the thickness of the hole transport region 13 was about 25 nanometers, the thickness of the mixed region 14 was about 110 nanometers, the thickness of the electron transport region 15 was about 20 nanometers, and the hole transport region 13, the mixed layer 14 and the electron transport region 15 were formed between an anode 12 comprised of indium-tin-oxide (ITO) having a thickness of about 200 nanometers, precoated on a glass substrate; and a cathode 18 comprised of a Mg:Ag (10:1 by weight) alloy having a thickness of about 120 nanometers. A thermal protective element comprised of silicon monoxide (SiO) and having a thickness of about 200 nanometers was coated on the cathode 16. The organic light emitting device was fabricated using a vacuum evaporation process at a pressure of about $6 \times 10^{-6}$ torr. The mixed region 14 was produced by coevaporation of pure, about 100 percent throughout for pure, NPB, pure $Alq_3$, and pure PtOEP from separate sources, with the single evaporation rates being varied between about 0.1–10 A/s to obtain the desired mixing ratio of the mixed region 14. Following formation of the organic hole transport region 13, the mixed region 14 and the electron transport region 15, the metal cathode 16 was deposited on the electron transport region 15 without breaking the vacuum.

When driven using an electric current of density equal to about 25 $mA/cm^2$, the organic light emitting device above generated bright red emission with luminance of about 250 $cd/m^2$, and color coordinates of about 0.679, 0.319 on the C.I.E. chart as measured by a Minolta model Cs-100 Chroma Meter, and when operated to obtain a luminance of about 100 $cd/m^2$, the external quantum efficiency of the organic light emitting device was about 4.2 percent as measured by a calibrated photodiode.

The operational device lifetime at room temperature (22° C.) was tested with the organic light emitting device being operated or activated using AC driving conditions at an average constant current density of 25 $mA/cm^2$ a nitrogen atmosphere. At this current density, the initial luminance of the organic light emitting device was about 250 $cd/m^2$ (candela per square meter). Under these conditions, the device half-life (time elapsed before the luminance of the organic light emitting device decreases to half the initial luminance) from an initial luminance of about 250 $cd/m^2$ is found to be about 4,000 hours for continuous device operation at this temperature. Since the device half-life is measured at an initial luminance of about 250 $cd/m^2$, which is about 2.5 times brighter than a typical initial display luminance of 100 $cd/m^2$ under normal conditions, the measured half-life of 4,000 hours represents an accelerated half-life under high stressing conditions at 22° C., which corresponds to a half-life of about 10,000 hours (2.5×4,000 hours) at 22° C. under a typical initial display luminance of 100 $cd/m^2$.

Also, the operational lifetime at a temperature of 90° C. (degrees Centigrade) was tested with the organic light emitting device operated using AC driving conditions at an average constant current density of 25 $mA/cm^2$ a nitrogen atmosphere. At this current density, the initial luminance of the prepared organic light emitting device was about 250 $cd/m^2$ (candela per square meter). Under these conditions, the device half-life (time elapsed before the luminance of the organic light emitting device decreases to half the initial luminance) from an initial luminance of about 250 $cd/m^2$ is found to be about 500 hours for continuous device operation at this temperature. Since the device half-life is measured at an initial luminance of about 250 $cd/m^2$, which is about 2.5 times brighter than a typical initial display luminance of 100 cd/m² under normal conditions, the measured half-life of 500 hours represents an accelerated half-life under high stressing conditions at 90° C., which corresponds to a half-life of about 1,250 hours (2.5×500 hours) at 90° C. under a typical initial display luminance of 100 cd/m².

This Example demonstrates that red organic light emitting devices according to embodiments of the present invention have a combination of desirable features which include (1) a high stability, such as, for example, a half-life of several hundreds of hours, even at elevated temperatures of about 80° C. to about 100° C., (2) a high quantum efficiency, such as, for example, an external quantum efficiency of 4 percent or higher when operated at a luminance of 100 cd/m² and in the same time, and (3) an excellent color purity, such as, for example, color coordinates of about 0.679, 0.319 on the C.I.E. chart.

EXAMPLE II

A series of organic light emitting devices with a structure, such as device 10 of FIG. 1, were formed and evaluated. In these devices a naphthyl-substituted benzidine derivative N,N'-di-1-naphthyl-N,N'-diphenyl-1,1'-biphenyl4,4'-diamine (NPB) and tris(8-hydroxyquinoline) aluminum (Alq$_3$) were used as the hole transport component and the electron transport component, respectively, comprising the hole transport 13 region, the mixed region 14, and the electron transport region 15 in the organic light emitting device 10. In a first device (device II-A), the mixed region 14 was comprised of about 48.5 weight percent of NPB; about 48.5 weight percent of Alq$_3$ and about 3 weight percent of 2,3,7,8,12,13,17,18-octaethyl-21H,23H-porphine platinum (II) (PtOEP). In a second device (device II-B), the mixed region 14 was comprised of about 47 weight percent of NPB; about 47 weight percent of Alq$_3$ and about 6 weight percent of 2,3,7,8,12,13,17,18-octaethyl-21H,23H-porphine platinum (II) (PtOEP). In a third device (device II-C), the mixed region 14 was comprised of about 44 weight percent of NPB; about 44 weight percent of Alq$_3$ and about 12 weight percent of 2,3,7,8,12,13,17,18-octaethyl-21H,23H-porphine platinum (II) (PtOEP). In a fourth device (device II-D), the mixed region 14 was comprised of about 38 weight percent of NPB; about 38 weight percent of Alq$_3$ and about 24 weight percent of 2,3,7,8,12,13,17,18-octaethyl-21H,23H-porphine platinum (II) (PtOEP). Copper phthalocyanine (CuPc) was used to form a buffer layer in the hole transport region 13, where the buffer layer was contacting the anode 12. In all devices, the thickness of the buffer layer was about 15 nanometers, the thickness of the hole transport region 13 was about 25 nanometers, the thickness of the mixed region 14 was about 110 nanometers., and the thickness of the electron transport region 15 was about 20 nanometers. The hole transport region 13, the mixed layer 14 and the electron transport region 15 were formed between an anode 12 comprised of indium-tin-oxide (ITO) having a thickness of about 200 nanometers, precoated on a glass substrate; and a cathode 18 comprised of a Mg:Ag (10:1 by weight) alloy having a thickness of about 120 nanometers. A thermal protective element comprised of silicon monoxide (SiO) and having a thickness of about 200 nanometers was coated on the cathode 16. The organic light emitting devices were fabricated using a vacuum evaporation process at a pressure of about 6×10$^{-6}$ torr. The mixed region 14 was produced by coevaporation of pure NPB, pure Alq$_3$, and pure PtOEP from separate sources with the single evaporation rates being varied between about 0.1–10 A/s to obtain the desired mixing ratio of the mixed region 14. Following formation of the organic hole transport region 13, the mixed region 14 and the electron transport region 15, the metal cathode 16 was deposited on the electron transport region 15 without breaking the vacuum.

When operated at an electric current of density equal to about 25 mA/cm², the organic light emitting devices produced a bright red emission with color coordinates, and luminance as shown in Table II-A.

TABLE II-A

| Device | Concentration of PtOEP in the Mixed Region (Weight Percent) | Color Coordinates | Luminance (cd/m²) |
| --- | --- | --- | --- |
| III-A | 3 | 0.664, 0.329 | 205 |
| III-B | 6 | 0.671, 0.325 | 210 |
| III-C | 12 | 0.679, 0.319 | 250 |
| III-D | 24 | 0.679, 0.320 | 220 |

From these results, device performance, and more specifically, the color purity and the luminance of the device were in embodiments related to the concentration of PtOEP in the mixed region 14, and therefore, optimum device performance, such as a performance which combines the highest luminance for a certain range of red color of saturated purity, such as, of color coordinates from about (0.671, 0.325) to about (0.679, 0.320) may be obtained by adjusting the concentration of PtOEP in the mixed region within a certain desirable range, such as, for example, from about 5 weight percent to about 25 weight percent.

Red organic light emitting devices according to the present invention can in embodiments be selected for use at various temperatures, such as about 20° C. to about 70° C.; for example, the devices can be used in various types of displays, such as, for example, in automobiles and other types of vehicles, computer monitors, televisions and others like electronic devices and systems. The devices can provide stable performance at high temperatures of at least, for example, about 50° C. or about 70° C. or even higher, like 100° C. for extended lifetimes. Thus, the organic light emitting devices according to this invention can be used in applications in which conventional bilayer devices would not be suitable. In addition, the organic light emitting devices according to this invention in embodiments can provide increased efficiency and improved color purity compared to other known organic light emitting devices.

Other embodiments and modifications of the present invention may occur to those skilled in the art subsequent to a review of the information presented herein; these embodiments and modifications, equivalents thereof, substantial equivalents thereof, or similar equivalents thereof are also included within the scope of this invention.

What is claimed is:

1. An organic light emitting device comprising (i) a first electrode;

(ii) a region comprising a mixture of (1) a tertiary aromatic amine, (2) a metal oxinoid, and (3) a red emitting material represented by wherein X is a carbon C atom or a nitrogen N atom or optionally oxygen or sulfur; $R_1$, $R_2$ and $R_3$ are each independently selected from the group consisting of hydrogen, alkyl, substituted alkyl, aryl, and substituted aryl; M is a divalent, trivalent or tetravalent metal;

(iii) a second electrode;

(iv) a protective element selected from the group consisting of silicon dioxide, silicon oxide, and mixtures thereof coated on at least one of the first and second electrodes, wherein one of said first and second electrodes is a hole injection anode, and one of said electrodes is an electron injection cathode; and at least one of (v) a hole transport region situated between the anode and the region (ii), and wherein the hole transport region comprises a layer comprised of a mixture of (i) from about 25 weight percent to about 99 weight percent of a porphyrin, and (ii) from about 75 weight percent to about 1 weight cement of an aromatic tertiary amine or an indolocarbazole and optionally includes a buffer layer; and (vi) an electron transport region situated between the cathode and the region (ii), and wherein said red emitting component is present in an amount of from 1 to about 40 weight percent based on total weights of components in region (II).

2. An organic light emitting device in accordance with claim 1 wherein the red emitting material is 2,3,7,8,12,13,17,18-octaethyl-21H,23H-porphine platinum (II) (PtOEP).

3. An organic light emitting device in accordance with claim 1 wherein the tertiary aromatic amine is N,N,N',N'-tetraaryl benzidine.

4. An organic light emitting device in accordance with claim 1 wherein said amine is N,N,N',N'-tetraaryl benzidine selected from the group consisting of N,N'-di(naphthalene-1-yl)-N,N'-diphenyl-benzidine (NPB) and N,N'-bis(p-biphenyl)-N,N'-diphenyl benzidine (biphenyl TPD); and optionally wherein the metal oxinoid is tris(8-hydroxyquinoline) aluminum ($Alq_3$).

5. An organic light emitting device in accordance with claim 1 wherein there is at least one of A. said hole transport region comprising a component or compound selected from the group consisting of tertiary aromatic amines, porphyrins, and indolocarbazoles; and B. said electron transport region containing a component selected from the group consisting of metal oxinoids, stilbenes, triazines, porphyrins, and quinolines.

6. An organic light emitting device in accordance with claim 1 wherein region (ii) comprises from about 20 weight percent to about 80 weight percent of said tertiary aromatic amine, and from about 80 weight percent to about 20 weight percent of said metal oxinoid; and wherein the weight percents are based on the total weight of components comprising the mixed region.

7. An organic light emitting device in accordance with claim 1 wherein region (ii) comprises from about 35 weight percent to about 65 weight percent of said tertiary aromatic amine; from about 65 weight percent to about 35 weight percent of said metal oxinoid; and from about 3 weight percent to about 30 weight percent of said red emitting component, and wherein the total thereof is about 100 weight percent.

8. An organic light emitting device in accordance with claim 7 wherein region (ii) comprises from about 5 weight percent to about 25 weight percent of said red emitting material.

9. An organic light emitting device in accordance with claim 1 wherein there is at least one of A, the component of the hole transport region (v) and the tertiary aromatic amine comprising region (ii) are similar; and B. the electron transport region (vi) and the metal oxinoid comprising region (ii) contain similar components.

10. An organic light emitting device in accordance with claim 1 wherein there is at least one of A. said component comprising said hole transport region (v) and the tertiary aromatic amine comprising region (ii) are dissimilar; and B. said component comprising said electron transport region (vi) and the metal oxinoid comprising the mixed region are dissimilar.

11. An organic light emitting device in accordance with claim 1 wherein an electron transport region is present, and wherein the electron transport region comprises at least two layers.

12. An organic light emitting device in accordance with claim 11 wherein a first layer of the electron transport region contacts the mixed region, and which first layer comprises a component selected from the group consisting of metal oxinoids, and quinolines; and a second layer of the electron transport region contacts the cathode, and which second layer comprises a component selected from the group of metal oxinoids, phthalocyanines, and triazines.

13. An organic light emitting device in accordance with claim 12 wherein the first layer contains a metal oxinoid of tris(8-hydroxyquinoline) aluminum ($Alq_3$), bis(8-hydroxyquinolato)-(4-phenylphenolato)aluminum (Balq), or a quinoline of 1,4-bis(4b-phenylquinolin-2-yl)benzene, 4,4'-bis(4-phenylquinolin-2-yl)-1,1'-biphenyl (TA); and the second layer contains a metal oxinoid comprising tris(8-hydroxyquinoline) aluminum ($Alq_3$) or bis(8-hydroxyquinolato)-(4-phenylphenolate)aluminum (Balq), a phthalocyanine of copper phthalocyanine (CuPc), or a triazine of 4,4'-bis-[2-(4,6-diphenyl-1,3,5-triazinyl)]-1,1'-biphenyl, 4,4'-bis-[2-(4,6-di-p-tolyl-1,3,5-triazinyl)]-1,1'-biphenyl, 4,4'-bis-[2-(4,6-di-m-tolyl-1,3,5-triazinyl)]-1,1'-biphenyl, 4,4'-bis-[2-(4,6-di-p-methoxyphenyl-1,3,5-triazinyl)]-1,1'-biphenyl, 4,4'-bis-[2-(4,6-di-m-methoxyphenyl-1,3,5-triazinyl)]-1,1'-biphenyl, or 2,4,6-tris(4-biphenylyl)-1,3,5-triazine.

14. An organic light emitting device in accordance with claim 1 wherein said hole transport region (v) is present, and wherein the hole transport region comprises at least two layers.

15. An organic light emitting device in accordance with claim 14 wherein a first layer of the hole transport region contacts the anode, and which first layer comprises a porphyrin; and wherein a second layer of the hole transport region contacts the mixed region, and which second layer comprises a component selected from the group of tertiary aromatic amines and indolocarbazoles.

16. An organic light emitting device in accordance with claim 15 wherein the first layer comprises copper phthalocyanine; and the second layer comprises a tertiary aromatic amine of N,N'-di(naphthalene-1-yl)-N,N'-diphenyl-benzidine (NPB) or N,N'-bis(p-biphenyl)-N,N'-diphenyl benzidine (biphenyl TPD), or an indolocarbazole of 5,11-di-naphthyl-5,11-dihydroindolo[3,2-b]carbazole or 2,8-dimethyl-5,11-di-naphthyl-5,11-dihydroindolo[3,2-b] carbazole.

17. An organic light emitting device in accordance with claim 1 wherein there is present at least one of (1) an anode comprising a layer comprised of indium-tin-oxide, and (2) a cathode comprising a layer selected from the group consisting of (i) a layer comprised of Mg and Ag: (ii) a layer comprised of Al; (iii) a layer comprised of indium-tin-oxide; and (iv) a layer comprised of a mixture of an organic compound, Mg and Ag.

18. An organic light emitting device in accordance with claim 17 wherein the cathode further comprises an alkaline metal or a compound thereof.

19. An organic light emitting device in accordance with claim 18 wherein the alkaline metal is selected from the group consisting of Li, Na, K and Cs.

20. An organic light emitting device in accordance with claim 1 wherein the protective element is present and is a thermal protective element, and which thermal protective element comprises a layer of SiO, SiO$_2$ or mixtures thereof.

21. An organic light emitting device in accordance with claim 1 wherein region (ii) has a thickness of from about 5 nanometers to about 500 nanometers; the hole transport region has a thickness of from about 5 nanometers to about 250 nanometers; and/or the electron transport region has a thickness of from about 5 nanometers to about 100 nanometers.

22. An organic light emitting device in accordance with claim 1 comprising
 (a) an anode of indium-tin-oxide with a thickness of from about 30 to about 300 nanometers coated on a substrate, the anode and the substrate being capable of transmitting at least about 70 percent of radiation of wavelength equal to or longer than about 400 nanometers;
 (b) a hole transport region contained on the anode and comprised of a compound selected from the group consisting of copper phthalocyanine (CuPc), N,N'-di(naphthalene-1-yl)-N,N'-diphenyl-benzidine (NPB), N,N'-bis(p-biphenyl)-N,N'-diphenyl benzidine (biphenyl TPD), 5,11-di-naphthyl-5,11-dihydroindolo[3,2-b]carbazole, and 2,8-dimethyl-5,11-di-naphthyl-5,11-dihydroindolo[3,2-b]carbazole; and which region has a thickness of from about 5 nanometers to about 100 nanometers;
 (c) a mixed region situated on the hole transport region and comprised of (1) from about 35 weight percent to about 65 weight percent of N,N'-di(naphthalene-1-yl)-N,N'-diphenyl-benzidine (NPB) or N,N'-bis(p-biphenyl)-N,N'-diphenyl benzidine (biphenyl TPD); (2) from about 65 weight percent to about 35 weight percent of tris(8-hydroxyquinoline) aluminum or bis(8-hydroxyquinolato)-(4-phenylphenolato)aluminum; and (3) from about 5 weight percent to about 25 weight percent of 2,3,7,8,12,13,17,18-octaethyl-21H,23H-porphine platinum (II) (PtOEP), and wherein all weight percentages are based on the total weight of components comprising the mixed region, and wherein the thickness of the mixed region is from about 50 nanometers to about 150 nanometers;
 (d) an electron transport region situated on the mixed region, and comprised of tris(8-hydroxyquinoline) aluminum (Alq$_3$) or bis(8-hydroxyquinolato)-(4-phenylphenolato)aluminum (Balq), and wherein the thickness of the electron transport region is from about 5 nanometers to about 50 nanometers;
 (e) a cathode situated on the electron transport region, and comprised of one of (1) a layer comprising a Mg:Ag alloy or Al of a Thickness of from about 50 nanometers to about 500 nanometers; or (2) a first layer comprised of from about 40 volume percent to about 55 volume percent of Mg; from about 2 volume percent to about 10 volume percent of Ag and from about 55 volume percent to about 40 volume percent of Alq3; wherein the thickness of the first layer is from about 100 nanometers to about 600 nanometers, and which first layer is coated with a second layer of a thickness of from about 50 nanometers to about 500 nanometers comprising a metal or a metal alloy; and
 (f) a protective layer situated on the cathode comprised of SiO, SiO$_2$ or mixtures thereof of a thickness of from about 100 nanometers to about 1,000 nanometers.

23. An organic light emitting device in accordance with claim 1 comprised of
 (a) an anode of indium-tin-oxide with a thickness of from about 30 to about 300 nanometers, which anode is coated on a substrate, the anode and the substrate being capable of transmitting at least 70 percent of radiation of wavelength longer than about 400 nanometers;
 (b) a hole transport region present on the anode and which region contains a component selected from the group consisting of N,N'-di(naphthalene-1-yl)-N,N'-diphenyl-benzidine (NPB), N,N'-bis(p-biphenyl)-N,N'-diphenyl benzidine (biphenyl TPD), 5,11-di-naphthyl-5,11-dihydroindolo[3,2-b]carbazole, and 2,8-dimethyl-5,11-di-naphthyl-5,11-dihydroindolo[3,2-b]carbazole, and which region further contains a buffer layer contacting the anode of copper phthalocyanine, wherein the thickness of the buffer layer is from about 10 nanometers to about 30 nanometers and the thickness of the hole transport region is from about 5 nanometers to about 20 nanometers greater than the thickness of the buffer layer;
 (c) a mixed region situated on the hole transport region comprised of (1) from about 35 weight percent to about 85 weight percent of N,N'-di(naphthalene-1-yl)-N,N'-diphenyl-benzidine (NPB) or N,N'-bis(p-blphenyl)-N,N'-diphenyl benzidine (biphenyl TPD); (2) from about 65 weight percent to about 35 weight percent of tris (8-hydroxyquinoline) aluminum or bis(8-hydroxyquinolato)-(4-phenylphenolato)aluminum and (3) from about 5 weight percent to about 25 weight percent of 2,3,7,8,12,13,17,18-octaethyl-21H,23H-porphine platinum (II) (PtOEP), wherein all weight percentages are based on the total weight of components comprising the mixed region, and wherein the thickness of the mixed region is from about 50 nanometers to about 150 nanometers;
 (d) an electron transport region situated on the mixed region of tris(8-hydroxyquinoline) aluminum (Alq$_3$) or bis(8-hydroxyquinolato)-(4-phenylphenolato) aluminum (Balq), wherein the thickness of the electron transport region is from about 5 nanometers to about 50 nanometers;

(e) a cathode situated on the electron transport region comprised of one of (1) a layer comprised of Mg:Ag alloy or Al of a thickness of from about 50 nanometers to about 500 nanometers; and or (2) a first layer comprised of from about 40 volume percent to about 55 volume percent of Mg; from about 2 volume percent to about 10 volume percent of Ag and from about 55 volume percent to about 40 volume percent of Alq$_3$, wherein the thickness of the first layer is from about 100 nanometers to about 600 nanometers; and which first layer is coated with a second layer of a thickness of from about 50 nanometers to about 500 nanometers comprising a metal or a metal alloy; and (f) an optional thermal layer situated on the cathode comprised of SiO, SiO$_2$ or mixtures thereof of a thickness of from about 100 nanometers to about 1,000 nanometers.

24. An organic light emitting device in accordance with claim 1 comprising (a) an anode of indium-tin-oxide with a thickness of from about 30 to about 300 nanometers, which anode is coated on a substrate, the anode and the substrate being capable of transmitting at least about 70 percent of radiation of wavelength longer than about 400 nanometers;

(b) a hole transport region situated on the anode comprised of at least one component selected from the group consisting of copper phthalocyanine (CuPc), N,N'-di(naphthalene-1-yl)-N,N'-diphenyl-benzidine (NPB), N,N'-bis(p-biphenyl)-N,N'-diphenyl benzidine (biphenyl TPD), 5,11-di-naphthyl-5,11-dihydroindolo[3,2-b]carbazole, and 2,8-dimethyl-5,11-di-naphthyl-5,11-dihydroindolo[3,2-b]carbazole; and which region has a thickness of from about 5 nanometers to about 100 nanometers;

(c) a mixed region situated on the hole transport region comprised of (1) from about 35 weight percent to about 65 weight percent of N,N'-di(naphthalene-1-yl)-N,N'-diphenyl-benzidine (NPB) or N,N'-bis(p-biphenyl)-N, N'-diphenyl benzidine (biphenyl TPD); (2) from about 65 weight percent to about 35 weight percent of tris (8-hydroxyquinoline) aluminum or bis(8-hydroxyquinolato)-(4-phenylphenolato)aluminum; and (3) from about 5 weight percent to about 25 weight percent of 2,3,7,8,12,13,17,18-octaethyl-21H,23H-porphine platinum (II) (PtOEP) wherein all weight percents are based on the total weight of components comprising the mixed region, and wherein the thickness of the mixed region is from about 50 nanometers to about 150 nanometers;

(d) an electron transport region situated on the mixed region comprising (1) a first layer of a thickness of from about 5 nanometers to about 25 nanometers contacting the mixed region wherein said first layer is comprised of tris(8-hydroxyquinoline) aluminum (Alq$_3$), bis(8-hydroxyquinolato)-(4-phenylphenolato)aluminum (Balq), 1,4-bis(4-phenylquinolin-2-yl)benzene, or 4,4'-bis(4-phenylquinolin-2-yl)-1,1'-biphenyl (TA); and (2) a second layer of a thickness of from about 5 nanometers to about 25 nanometers contacting the cathode, wherein the second layer is comprised of tris(8-hydroxyquinoline) aluminum (Alq$_3$), bis(8-hydroxyquinolato)-(4-phenylphenolato)aluminum (Balq), copper phthalocyanine (CuPc), 4,4'-bis-[2-(4,6-diphenyl-1,3,5-triazinyl)]-1,1'-biphenyl, 4,4'-bis-[2-(4,6-di-p-tolyl-1,3,5-triazinyl)]-1,1'-biphenyl, 4,4'-bis-[2-(4,6-di-m-tolyl-1,3,5-triazinyl)]-1,1'-biphenyl, 4,4'-bis-[2-(4,6-di-p-methoxyphenyl-1,3,5-triazinyl)]-1,1'-biphenyl, 4,4'-bis-[2-(4,6-di-m-methoxyphenyl-1,3,5-triazinyl)]-1,1'-biphenyl, or 2,4,6-tris(4-biphenylyl)-1,3,5-triazine;

(e) a cathode situated on the electron transport region comprised of one of (1) a layer comprising Mg:Ag alloy or Al of a thickness of from about 50 nanometers to about 500 nanometers; or (2) a first layer comprised of from about 40 volume percent to about 55 volume percent of Mg; from about 2 volume percent to about 10 volume percent of Ag; and from about 55 volume percent to about 40 volume percent of Alq$_3$, wherein the thickness of the first layer is from about 100 nanometers to about 600 nanometers, and coated with a second layer of a thickness of from about 50 nanometers to about 500 nanometers comprising a metal or a metal alloy; and (f) a thermal protective component situated on the cathode comprised of SiO, SiO$_2$ or mixtures thereof of a thickness of from about 100 nanometers to about 1,000 nanometers.

25. An organic light emitting device in accordance with claim 1 comprising (a) an anode of indium-tin-oxide with a thickness of from about 30 to about 300 nanometers, which anode is coated on a substrate, the anode and the substrate being capable of transmitting at least about 70 percent of radiation of wavelength longer than about 400 nanometers;

(b) a hole transport region present on and in contact with the anode comprised of a component selected from the group consisting of N,N'-di(naphthalene-1-yl)-N,N'-diphenyl-benzidine (NPB), N,N'-bis(p-biphenyl)-N,N'-diphenyl benzidine (biphenyl TPD), 5,11-di-naphthyl-5,11-dihydroindolo[3,2-b]carbazole, and 8-dimethyl-5,11-di-naphthyl-5,11-dihydroindolo[3,2-b]carbazole; and which region further comprises a buffer layer contacting the anode, and comprised of copper phthalocyanine, wherein the thickness of the buffer layer is from about 10 nanometers to about 30 nanometers; and the thickness of the hole transport region is from about 5 nanometers to about 20 nanometers greater than the thickness of the buffer layer;

(c) a mixed region situated on the hole transport region comprised of (1) from about 35 weight percent to about 65 weight percent of N,N'-di(naphthalene-1-yl)-N,N'-diphenyl-benzidine (NPB) or N,N'-bis(p-biphenyl)-N, N'-diphenyl benzidine (biphenyl TPD); (2) from about 65 weight percent to about 35 weight percent of tris (8-hydroxyquinoline) aluminum or bis(8-hydroxyquinolato)-(4-phenylphenolato)aluminum and (3) from about 5 weight percent to about 25 weight percent of 2,3,7,8,12,13,17,18-octaethyl-21H,23H-porphine platinum (II) (PtOEP), wherein all weight percentages are based on the total weight of materials comprising the mixed region, and wherein the thickness of the mixed region is from about 50 nanometers to about 150 nanometers;

(d) an electron transport region situated on the mixed region comprising (1) a first layer of a thickness of from about 5 nanometers to about 25 nanometers contacting the mixed region, wherein this first layer is comprised of tris(8-hydroxyquinoline) aluminum (Alq$_3$), bis(8-hydroxyquinolato)-(4-phenylphenolato)aluminum (Balq), and 1,4-bis(4-phenylquinolin-2-yl)benzene, 4,4'-bis(4-phenylquinolin-2-yl)-1,1'-biphenyl (TA); and (2) a second layer of a thickness of from about 5 nanometers to about 25 nanometers contacting the cathode, wherein the second is comprised of tris(8-hydroxyquinoline) aluminum (Alq$_3$), bis(8-hydroxyquinolato)-(4-phenylphenolato)aluminum (Balq), copper phthalocyanine (CuPC), 4,4'-bis-[2-(4, 6-diphenyl-1,3,5-triazinyl)]-1,1'-biphenyl, 4,4'-bis-[2-(4,6-di-p-tolyl-1,3,5-triazinyl)]-1,1'-biphenyl, 4,4'-bis-[2-(4,6-di-m-tolyl-1,3,5-triazinyl)]-1,1'-biphenyl, 4,4'-bis-[2-(4,6-di-p-methoxyphenyl-1,3,5-triazinyl)]-1,1'-biphenyl, and 4,4'-bis-[2-(4,6-di-m-methoxyphenyl-1, 3,5-triazinyl)]-1,1'-biphenyl, or 2,4,6-tris(4-biphenylyl)-1,3,5-triazine;

(e) a cathode situated on the electron transport region comprised of one of (1) a layer comprised of Mg:Ag alloy or Al of a thickness of tram about 50 nanometers to about 500 nanometers; or (2) a first layer comprised of from about 40 volume percent to about 55 volume percent of Mg: from about 2 volume percent to about 10 volume percent of Ag; and from about 55 volume percent to about 40 volume percent of Alq$_3$, wherein the thickness of the first layer is from about 100 nanometers to about 600 nanometers, and coated with a second layer of a thickness of from about 50 nanometers to about 500 nanometers comprising a metal or a metal alloy; and (f) a thermal protective element situated on the cathode comprised of SiO, SiO$_2$ or mixtures thereof of a thickness of from about 100 nanometers to about 1,000 nanometers.

26. A display comprising at least one organic light emitting device according to claim 1.

27. An organic light emitting device in accordance with claim 1 wherein X is oxygen, or sulfur.

28. An organic light emitting device in accordance with claim 1 wherein R$_1$ and R$_2$ alkyl contain from about 1 to about 20 carbon atoms; and R$_1$ and R$_2$ aryl contain from about 6 to about 36 carbon atoms.

29. An organic light emitting device in accordance with claim 1 wherein R$_3$ alkyl contains from about 1 to about 20 carbon atoms.

30. An organic light emitting device in accordance with claim 1 wherein each of said regions comprises from about 1 to about 20 layers.

31. An organic tight emitting device in accordance with claim 1 wherein each of said regions comprises from about 1 to about 5 layers.

32. An organic light emitting device in accordance with claim 1 wherein each of said regions is from about 1 to about 3 layers.

33. An organic light emitting device in accordance with claim 1 wherein each of said regions is from about 2 to about 4 layers.

34. An organic light emitting device in accordance with claim 1 wherein each of said regions is one layer.

35. An organic light emitting device in accordance with claim 1 wherein said emitter amount is from about 5 to about 25 weight percent.

36. An organic light emitting device in accordance with claim 1 wherein said red emitter amount is from about 10 to about 20 weight percent.

37. An organic light emitting device in accordance with claim 1 wherein said M is aluminum, gallium, zinc or indium.

38. A device comprising a first electrode, a second electrode, a region comprised of a mixture of a tertiary aromatic amine, a metal oxinoid and an emitting compound; a protective layer, and at least one of a hole transport region and an electron transport region, wherein one of said first and said second electrode is a cathode and wherein one is an anode; wherein the hole transport region is situated between the anode and the mixed region; wherein the electron transport region is situated between the cathode and the mixed region; wherein said light emitting compound is present in an amount of from 1 to about 40 weight percent and wherein said emitting compound is wherein X is a carbon C atom or a nitrogen N atom, or optionally oxygen or sulfur; R$_1$, R$_2$ and R$_3$ are each independently selected from the group consisting of hydrogen, alkyl, substituted alkyl, aryl, and substituted awl; and M is a divalent, trivalent or tetravalent metal.

* * * * *